US009318670B2

(12) United States Patent
Yuan et al.

(10) Patent No.: US 9,318,670 B2
(45) Date of Patent: Apr. 19, 2016

(54) MATERIALS FOR PHOTOLUMINESCENCE WAVELENGTH CONVERTED SOLID-STATE LIGHT EMITTING DEVICES AND ARRANGEMENTS

(71) Applicant: Intematix Corporation, Fremont, CA (US)

(72) Inventors: Xianglong Yuan, Fremont, CA (US); Binghua Chai, Fremont, CA (US); Yi-Qun Li, Danville, CA (US)

(73) Assignee: Intematix Corporation, Fremont, CA (US)

(*) Notice: Subject to any disclaimer, the term of this patent is extended or adjusted under 35 U.S.C. 154(b) by 0 days.

(21) Appl. No.: 14/469,523

(22) Filed: Aug. 26, 2014

(65) Prior Publication Data

US 2015/0340573 A1 Nov. 26, 2015

Related U.S. Application Data

(60) Provisional application No. 62/001,596, filed on May 21, 2014.

(51) Int. Cl.
*C09K 11/02* (2006.01)
*H01L 33/50* (2010.01)
*H01L 33/00* (2010.01)
*C09K 11/77* (2006.01)
*C09K 11/08* (2006.01)

(52) U.S. Cl.
CPC .............. *H01L 33/504* (2013.01); *C09K 11/02* (2013.01); *C09K 11/025* (2013.01); *C09K 11/0883* (2013.01); *C09K 11/7734* (2013.01); *C09K 11/7774* (2013.01); *H01L 33/0095* (2013.01); *H01L 2933/0041* (2013.01)

(58) Field of Classification Search
CPC .. C09K 11/02; C09K 11/025; C09K 11/7774; C09K 11/7734; C09K 11/0883
See application file for complete search history.

(56) References Cited

U.S. PATENT DOCUMENTS

| | | | |
|---|---|---|---|
| 3,290,255 A | 12/1966 | Smith | |
| 3,593,055 A | 7/1971 | Geusic et al. | |
| 3,670,193 A | 6/1972 | Thorington et al. | |
| 3,676,668 A | 7/1972 | Collins et al. | |
| 3,691,482 A | 9/1972 | Pinnow et al. | |
| 3,709,685 A | 1/1973 | Hercock et al. | |
| 3,743,833 A | 7/1973 | Martie et al. | |
| 3,763,405 A | 10/1973 | Mitsuhata | |
| 3,793,046 A | 2/1974 | Wanmaker et al. | |
| 3,819,973 A | 6/1974 | Hosford | |
| 3,819,974 A | 6/1974 | Stevenson et al. | |
| 3,849,707 A | 11/1974 | Braslau et al. | |
| 3,875,456 A | 4/1975 | Kana et al. | |
| 3,932,881 A | 1/1976 | Mita et al. | |
| 3,937,998 A | 2/1976 | Verstegen et al. | |
| 3,972,717 A | 8/1976 | Wiedemann | |
| 4,047,075 A | 9/1977 | Schoberl | |
| 4,081,764 A | 3/1978 | Christmann et al. | |
| 4,104,076 A | 8/1978 | Pons | |
| 4,143,394 A | 3/1979 | Schoberl | |
| 4,176,294 A | 11/1979 | Thornton, Jr. | |
| 4,176,299 A | 11/1979 | Thornton | |
| 4,211,955 A | 7/1980 | Ray | |
| 4,305,019 A | 12/1981 | Graff et al. | |
| 4,315,192 A | 2/1982 | Skwirut et al. | |
| 4,443,532 A | 4/1984 | Joy et al. | |
| 4,559,470 A | 12/1985 | Murakami et al. | |
| 4,573,766 A | 3/1986 | Bournay, Jr. et al. | |
| 4,618,555 A | 10/1986 | Suzuki et al. | |
| 4,638,214 A | 1/1987 | Beers et al. | |
| 4,667,036 A | 5/1987 | Iden et al. | |
| 4,678,285 A | 7/1987 | Ohta et al. | |
| 4,727,003 A | 2/1988 | Ohseto et al. | |
| 4,772,885 A | 9/1988 | Uehara et al. | |
| 4,845,223 A | 7/1989 | Seybold et al. | |
| 4,859,539 A | 8/1989 | Tomko et al. | |
| 4,915,478 A | 4/1990 | Lenko et al. | |

(Continued)

FOREIGN PATENT DOCUMENTS

| | | |
|---|---|---|
| EP | 647694 | 4/1995 |
| GB | 2 017 409 | 10/1979 |

(Continued)

OTHER PUBLICATIONS

"Fraunhofer-Gesellschaft: Research News Special1997", http://www.fhg.de/press/md-e/md1997/sondert2.hlm,(accessed on Jul. 23, 1998), Jan. 1997, Publisher: Fraunhofer Institute.

Adachi, C. et al., "Blue light-emitting organic electroluminescent devices", "Appl. Phys. Lett.", Feb. 26, 1990, pp. 799-801, vol. 56, No. 9.

Akasaki, Isamu, et al., "Photoluminescence of Mg-doped p-type GaN and electroluminescence of GaN p-n junction LED", "Journal of Luminescence", Jan.-Feb. 1991, pp. 666-670, vol. 48-49 pt. 2.

Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.

(Continued)

*Primary Examiner* — Carol M Koslow
(74) *Attorney, Agent, or Firm* — Vista IP Law Group, LLP

(57) ABSTRACT

A photoluminescence material paste comprises: a first inorganic photoluminescence material having a first density, a second inorganic photoluminescence material having a second density and a light transmissive non-curable silicone fluid that is not curable by itself. The first density of the first inorganic photoluminescence material is different from the second density of the second inorganic photoluminescence material. The first and second inorganic photoluminescence materials are substantially homogenously distributed within the light transmissive non-curable silicone fluid to form the photoluminescence material paste. A weight loading of the first and second photoluminescence materials in the photoluminescence material paste is in a range of about 60% to about 95%.

30 Claims, 9 Drawing Sheets

(56) References Cited

U.S. PATENT DOCUMENTS

| | | | |
|---|---|---|---|
| 4,918,497 A | 4/1990 | Edmond | |
| 4,946,621 A | 8/1990 | Fouassier et al. | |
| 4,992,704 A | 2/1991 | Stinson | |
| 5,077,161 A | 12/1991 | Law | |
| 5,110,931 A | 5/1992 | Dietz et al. | |
| 5,126,214 A | 6/1992 | Tokailin et al. | |
| 5,131,916 A | 7/1992 | Eichenauer et al. | |
| 5,143,433 A | 9/1992 | Farrell | |
| 5,143,438 A | 9/1992 | Giddens et al. | |
| 5,166,761 A | 11/1992 | Olson et al. | |
| 5,208,462 A | 5/1993 | O'Connor et al. | |
| 5,210,051 A | 5/1993 | Carter, Jr. | |
| 5,211,467 A | 5/1993 | Seder | |
| 5,237,182 A | 8/1993 | Kitagawa et al. | |
| 5,264,034 A | 11/1993 | Dietz et al. | |
| 5,283,425 A | 2/1994 | Imamura | |
| 5,369,289 A | 11/1994 | Tamaki et al. | |
| 5,405,709 A | 4/1995 | Littman et al. | |
| 5,439,971 A | 8/1995 | Hyche | |
| 5,518,808 A | 5/1996 | Bruno et al. | |
| 5,535,230 A | 7/1996 | Abe | |
| 5,557,168 A | 9/1996 | Nakajima et al. | |
| 5,563,621 A | 10/1996 | Silsby | |
| 5,578,839 A | 11/1996 | Nakamura et al. | |
| 5,583,349 A | 12/1996 | Norman et al. | |
| 5,585,640 A | 12/1996 | Huston et al. | |
| 5,619,356 A | 4/1997 | Kozo et al. | |
| 5,660,461 A | 8/1997 | Ignatius et al. | |
| 5,677,417 A | 10/1997 | Muellen et al. | |
| 5,679,152 A | 10/1997 | Tischler et al. | |
| 5,763,901 A | 6/1998 | Komoto et al. | |
| 5,770,887 A | 6/1998 | Tadatomo et al. | |
| 5,771,039 A | 6/1998 | Ditzik | |
| 5,777,350 A | 7/1998 | Nakamura et al. | |
| 5,869,199 A | 2/1999 | Kido | |
| 5,959,316 A | 9/1999 | Lowery | |
| 5,962,971 A | 10/1999 | Chen | |
| 5,998,925 A | 12/1999 | Shimizu | |
| 6,072,272 A | 6/2000 | Rumbaugh | |
| 6,137,217 A | 10/2000 | Pappalardo et al. | |
| 6,340,824 B1 | 1/2002 | Komoto et al. | |
| 6,504,301 B1 | 1/2003 | Lowery | |
| 6,576,488 B2 | 6/2003 | Collins et al. | |
| 6,600,175 B1 | 7/2003 | Baretz et al. | |
| 6,642,618 B2 | 11/2003 | Yagi et al. | |
| 6,642,652 B2 | 11/2003 | Collins et al. | |
| 6,869,812 B1 | 3/2005 | Liu | |
| 7,153,015 B2 | 12/2006 | Brukilacchio | |
| 7,311,858 B2 | 12/2007 | Wang | |
| 7,390,437 B2 | 6/2008 | Dong | |
| 7,479,662 B2 | 1/2009 | Soules et al. | |
| 7,575,697 B2 | 8/2009 | Li | |
| 7,601,276 B2 | 10/2009 | Li | |
| 7,615,795 B2 | 11/2009 | Baretz et al. | |
| 7,655,156 B2 | 2/2010 | Cheng | |
| 7,863,808 B2 | 1/2011 | Terao | |
| 7,937,865 B2 | 5/2011 | Li et al. | |
| 7,943,945 B2 | 5/2011 | Baretz et al. | |
| 8,044,575 B2 | 10/2011 | Kawamura | |
| 8,274,215 B2 | 9/2012 | Liu et al. | |
| 8,400,396 B2 | 3/2013 | Feng et al. | |
| 8,539,702 B2 | 9/2013 | Li et al. | |
| 8,597,545 B1* | 12/2013 | Liu et al. | 252/301.4 F |
| 8,618,559 B2 | 12/2013 | Hamaguchi et al. | |
| 8,631,598 B2 | 1/2014 | Li et al. | |
| 8,663,502 B2* | 3/2014 | Tao et al. | 252/301.4 F |
| 8,795,817 B2 | 8/2014 | Kwak et al. | |
| 8,796,050 B2 | 8/2014 | Yoo et al. | |
| 8,796,712 B2 | 8/2014 | Ooyabu et al. | |
| 2001/0019240 A1 | 9/2001 | Takahashi | |
| 2004/0016938 A1 | 1/2004 | Baretz et al. | |
| 2006/0049416 A1 | 3/2006 | Baretz et al. | |
| 2006/0158090 A1 | 7/2006 | Wang et al. | |
| 2007/0031097 A1 | 2/2007 | Heikenfeld et al. | |
| 2007/0138438 A1 | 6/2007 | Hampden-Smith et al. | |
| 2007/0240346 A1 | 10/2007 | Li et al. | |
| 2008/0111472 A1 | 5/2008 | Liu et al. | |
| 2008/0116785 A1 | 5/2008 | Ohno et al. | |
| 2008/0218992 A1 | 9/2008 | Li | |
| 2008/0224597 A1 | 9/2008 | Baretz et al. | |
| 2008/0224598 A1 | 9/2008 | Baretz et al. | |
| 2009/0283721 A1 | 11/2009 | Liu et al. | |
| 2010/0079980 A1 | 4/2010 | Sakai | |
| 2010/0276712 A1* | 11/2010 | Shaikevitch et al. | 257/98 |
| 2010/0295079 A1 | 11/2010 | Melman | |
| 2010/0301758 A1 | 12/2010 | Chen | |
| 2010/0321339 A1 | 12/2010 | Kimmel | |
| 2011/0261290 A1 | 10/2011 | Kim et al. | |
| 2012/0112130 A1* | 5/2012 | Wu et al. | 252/301.4 P |
| 2012/0286208 A1* | 11/2012 | Mckean et al. | 252/301.36 |

FOREIGN PATENT DOCUMENTS

| | | |
|---|---|---|
| JP | S50-79379 | 11/1973 |
| JP | 60170194 | 9/1985 |
| JP | 862-189770 | 8/1987 |
| JP | H01-1794 71 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | H07-176794 | 7/1995 |
| JP | 07-235207 | 9/1995 |
| JP | H7-282609 | 10/1995 |
| JP | H08-7614 | 1/1996 |
| JP | 8-250281 | 9/1996 |
| JP | 2900928 | 3/1999 |
| JP | 2000286454 | 10/2000 |
| JP | 2002241586 A | 8/2002 |
| JP | 2002359404 A | 12/2002 |
| JP | 2003046133 | 2/2003 |
| JP | P2003-234513 | 8/2003 |
| JP | 2004153109 A | 5/2004 |
| JP | P3724490 | 9/2005 |
| JP | P3724498 | 9/2005 |
| JP | 2005277441 A | 10/2005 |
| JP | 2008130279 A | 6/2008 |
| JP | 2009102514 A | 5/2009 |
| JP | 2009158119 A | 7/2009 |
| JP | 2009530437 A | 8/2009 |
| JP | 2009209316 A | 9/2009 |
| JP | 2010151877 A | 7/2010 |
| TW | 200814377 A | 3/2008 |
| TW | 200926459 A | 6/2009 |
| TW | 200929621 A | 7/2009 |
| WO | WO 9108508 | 6/1991 |
| WO | WO 2007103394 A2 | 9/2007 |
| WO | WO 2010074963 A1 | 7/2010 |
| WO | WO 2010123059 A1 | 10/2010 |

OTHER PUBLICATIONS

Apr. 14, 2010 Office Action in U.S. Appl. No. 11/264,124.
Apr. 15, 2009 Office Action in U.S. Appl. No. 11/264,124, issued by Abu I Kalam.
Armaroli, N. et al., "Supramolecular Photochemistry and Photophysics.", "J. Am. Chern. Soc.", 1994, pp. 5211-5217, vol. 116.
Aug. 21, 2006 Office Action in U.S. Appl. No. 10/623,198, issued by Thao X. Le.
Aug. 24, 2007 Office Action in U.S. Appl. No. 11/264,124, issued by Thao X. Le.
Aug. 26, 2010 Office Action in U.S. Appl. No. 12/131,118.
Berggren, M. et al., "Light-emitting diodes with variable colours from polymer blends", "Nature", Dec. 1, 1994, pp. 444-446, vol. 372.

(56) References Cited

OTHER PUBLICATIONS

Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.
Bradfield, P.L., et al., "Electroluminescence from sulfur impurities in a p-n junction formed in epitaxial silicon", "Appl. Phys. Lett", 07110/1989, pp. 10D-102, vol. 55, No. 2.
Chao, Zhang Jin, et al., "White light emitting glasses", "Journal of Solid State Chemistry", 1991, pp. 17-29, vol. 93.
Comrie, M. , "Full Color LED Added to Lumex's Lineup", "EBN", Jun. 19, 1995, p. 28.
CRC Handbook, 63rd Ed., (1983) p. E-201.
Das, N.C., et al., "Luminescence spectra of ann-channel metal-oxide-semiconductor field-effect transistor at breakdown", 1990, pp. 1152-1153, vol. 56, No. 12.
Dec. 16. 2004 Office Action in U.S. Appl. No. 10/623,198, issued by Thao X. Le.
Dictionary Definition of Phosphor, Oxford English Dictionary Online, Mar. 9, 2012 (Only partial available due to corrupt file, on Mar. 22, 2012 in U.S. Appl. No. 12/131,119; Request for Full Reference filed).
El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.
Feb. 21, 2012 Office Action in U.S. Appl. No. 12/131,118, issued by Abul Kalam.
Feb. 26, 2008 Office Action in U.S. Appl. No. 11/264,124, issued by Abu I Kalam.
Feb. 4, 2005 Office Action in U.S. Appl. No. 10/623,198, issued by Thao X. Le.
Feb. 7, 2007 Office Action in U.S. Appl. No. 11/264,124, issued by Thao X. Le.
Forrest, S. et al. , "Organic emitters promise a new generation of displays", "Laser Focus World", Feb. 1995, pp. 99-107.
Hamada, Y. et al., "Blue-Light-Emitting Organic Electroluminescent Devices with Oxadiazole Dimer Dyes as an Emitter", "Jpn. J. Appl. Physics", Jun. 1992, pp. 1812-1816, vol. 31.
Hamakawa, Yoshihiro, et al., "Toward a visible light display by amorphous SiC:H alloy system", "Optoelectronics—Devices and Technologies", Dec. 1989, pp. 281-294, vol. 4, No. 2.
Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.
Jang, S., "Effect of Avalanche-Induced Light Emission on the Multiplication Factor in Bipolar Junction Transistors", "Solid-State Electronics", 1991, pp. 1191-1196, vol. 34, No. 11.
Jan. 29, 2007 Office Action in U.S. Appl. No. 10/623,198, issued by Thao X. Le.
Jan. 30, 2006 Office Action in U.S. Appl. No. 11/264,124, issued by Thao X. Le.
Jan. 7, 2011 Office Action in U.S. Appl. No. 12/131,119, issued by Steven Y. Horikoshi.
Jul. 10, 2008 Office Action in U.S. Appl. No. 11/264,124, issued by Abu I Kalam.
Jul. 14, 2005 Notice of Allowability, Notice of Allowability, and Examiners Statement of Reasons for Allowance in U.S. Appl. No. 10/623,198, issued by Thao X. Le.
Jul. 14, 2011 Office Action in U.S. Appl. No. 12/131,119, issued by Steve Horikoshi.
Jul. 7, 2011 Office Action in U.S. Appl. No. 12/131,118, issued by Abu I Kalam.
Jun. 14, 2006 Office Action in U.S. Appl. No. 11/264,124, issued by Thao X. Le.
Jun. 26, 2007 Office Action in U.S. Appl. No. 10/623,198, issued by Thao X. Le.
Kido, J. et al. , "1,2,4-Triazole Derivative as an Electron Transport Layer in Organic Luminescent Devices", "Jpn. J. Appl. Phys. ", Jul. 1, 1993, pp. L917-L920, vol. 32.

Kido, J. et al. , "Bright blue electroluminescence from poly(N-vinylcarbazole)", "Appl. Phys. Letters", Nov. 8, 1993, pp. 2627-2629, vol. 63, No. 19.
Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.
Krames, M., et al., "Status and Future of High-Power Light-Emitting Diodes for Solid-Slate Lighting", "Journal of Display Technology", Jun. 2007, pp. 160-175, vol. 3, No. 2.
Kudryashov, V., et al., "Spectra of Superbright Blue and Green InGaN/AlGaN/GaN Light-Emitting diodes", "Journal of the European Ceramic Society", May 1996, pp. 2033-2037, vol. 17.
Larach, S., et al., "Blue emitting luminescent phosphors: Review and status", "Int'l Workshop on Electroluminescence", 1990, pp. 137-143.
LEDs and Laser Diodes, Electus Distribution, copyright 2001, available at URL:http://www.jaycar.com.au/images_uploaded/ledlaser.Pdf.
Lester, S., et al., "High dislocation densities in high efficiency GaN-based light-emitting diodes", "Appl. Phys. Lett.", Mar. 6, 1995, pp. 1249-1251, vol. 66, No. 10.
Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdf?title=Technicai%20Datasheet&asset_type=pds/pdf&language=EN&urn=urn:documentum:eCommerce_soi_EU:09007bb280021e27.pdf:09007bb280021e27.pdf.
Mar. 2, 2009 Office Action in U.S. Appl. No. 10/623,198, issued by Abu I Kalam.
Mar. 22, 2012 Office Action in U.S. Appl. No. 12/131,119, issued by Steven Y. Horikoshi.
Mar. 28, 2006 Office Action in U.S. Appl. No. 10/623,198, issued by Thao X. Le.
Mar. 4, 2011 Notice of Allowance, Notice of Allowability, Examiner's Interview Summary, Examiner's Amendment/Comment and Examiner's Statement of Reason for Allowance in U.S. Appl. No. 11/264,124, issued by Abu I Kalam.
Mar. 7, 2008 Office Action in U.S. Appl. No. 10/623,198, issued by Abu I Kalam.
Maruska, H.P., "Gallium nitride light-emitting diodes (dissertation)", "Dissertation Submitted to Stanford University", Nov. 1973.
Maruska, H.P., et al., "Violet luminescence of Mg-doped GaN", "Appl. Phys. Lett.", Mar. 15, 1973, pp. 303-305, vol. 22, No. 6.
May 4, 2010 Office Action in U.S. Appl. No. 12/131,119.
McGraw-Hill, "McGraw-Hill Dictionary of Scientific and Technical Terms, Third Edition", "McGraw-Hill Dictionary of Scientific and Technical Terms", 1984, p. 912 and 1446, Publisher: McGraw-Hill.
McGraw-Hill, "McGraw-Hill Encyclopedia of Science and Technology, Sixth Edition", "McGraw-Hill Encyclopedia of Science and Technology", 1987, p. 582 and 60-63, vol. 9-10, Publisher: McGraw-Hill.
Mimura, Hidenori, et al., "Visible electroluminescence from uc-SiC/porous Si/c-Si p-n junctions", "Int. J. Optoelectron.", 1994, pp. 211-215, vol. 9, No. 2.
Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.
Morkoc et al., "Large-band-gap SIC, 111-V nitride, and II-VI ZnSe-based semiconductor device technologies", J. Appl. Phys. 76(3), 1; Mar. 17, 1994; Illinois University.
Muench, W.V., et al., "Silicon carbide light-emitting diodes with epitaxial junctions", "Solid-State Electronics", Oct. 1976, pp. 871-874, vol. 19, No. 10.
Mukai, T., et al., "Recent progress of nitride-based light emitting devices", "Phys. Stat. Sol.", Sep. 2003, p. 52-57, vol. 200, No. 1.
Nakamura, S., et al., "High-power InGaN single-quantum-well-structure blue and violet light-emitting diodes", "Appl. Phys. Lett.", Sep. 25, 1995, pp. 1868-1870, vol. 67, No. 13.
Nakamura, S., et al., "The Blue Laser Diode: GaN Based Light Emitters and Lasers", Mar. 21, 1997, p. 239, Publisher: Springer-Verlag.

(56) References Cited

OTHER PUBLICATIONS

Nakamura, S., et al., "The Blue Laser Diode: The Complete Story, 2nd Revised and Enlarged Edition", Oct. 2000, pp. 237-240, Publisher: Springer-Verlag.
Nov. 30. 2010 Office Action in U.S. Appl. No. 12/131,118.
Oct. 20, 2008 Office Action in U.S. Appl. No. 10/623,198, issued by Abu I Kalam.
Pankove, J.I., et al., "Scanning electron microscopy studies of GaN", "Journal of Applied Physics", Apr. 1975, pp. 1647-1652, vol. 46, No. 4.
Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.
Pei, Q, et al., "Polymer Light-Emitting Electrochemical Cells", "Science", Aug. 25, 1995, pp. 1086-1088, vol. 269, No. 5227.
Reexam Advisory Action dated Sep. 28, 2012 for U.S. Appl. No. 90/010,940.
Reexam Final Office Action dated May 24, 2012 for U.S. Appl. No. 90/010,940.
Reexam Final Office Action dated Nov. 7, 2011 for U.S. Appl. No. 90/010,940.
Reexam Non-Final Office Action dated Jan. 26, 2012 for U.S. Appl. No. 90/010,940.
Reexam Non-Final Office Action dated Mar. 3, 2011 for U.S. Appl. No. 90/010,940.
Reexam Non-Final Office Action dated Sep. 20, 2010 for U.S. Appl. No. 90/010,940.
Roman. D., "LEDs Turn a Brighter Blue", "Electronic Buyers' News", Jun. 19, 1995, pp. 28 and 35, vol. 960, Publisher: CMP Media LLC.
Saleh and Teich, Fundamentals of Photonics, New York: John Wiley & Sons, 1991, pp. 592-594.
Sato, Yuichi, et al., "Full-color fluorescent display devices using a near-UV light-emitting diode", "Japanese Journal of Applied Physics", Jul. 1996, pp. L838-L839, vol. 35, No. ?A.
Sep. 17, 2009 Notice of Allowance, Notice of Allowability, Examiner's Amendmeni/Comment, and Examiner's Statement of Reasons for Allowance in U.S. Appl. No. 10/623,198, issued by Abul Kalam.
Sep. 29, 2009 Office Action in U.S. Appl. No. 11/264,124, issued by Abu I Kalam.
Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.
Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.
The Penguin Dictionary of Electronics, 3rd edition, pp. 315,437-438, 509-510, copyright 1979, 1988, and 1998.
Ura, M. , "Recent trends of development of silicon monocarbide blue-light emission diodes", "Kinzoku", 1989, p. 11-15, vol. 59, No. 9.
Werner, K. , "Higher Visibility for LEDs", "IEEE Spectrum", Jul. 1994, pp. 30-39.
Wojciechowski, J. et al. , "Infrared-To-Blue Up-Converting Phosphor", "Electron Technology", 1978, pp. 31-47, vol. 11, No. 3.
Yamaguchi, Y. et al., "High-Brightness SiC Blue LEDs and Their Application to Full Color LED Lamps", "Optoelectronics-Devices and Technologies", Jun. 1992, pp. 57-67, vol. 7, No. 1.
Yang, Y., et al., "Voltage controlled two color light-emitting electrochemical cells", "Appl. Phys. Lett.", 1996, vol. 68, No. 19.
Yoshimi, Masashi, et al., "Amorphous carbon basis blue light electroluminescent device", "Optoelectronics- Devices and Technologies", Jun. 1992, pp. 69-81, vol. 7, No. 1.
Zanoni, E., et al., "Impact ionization, recombination, and visible light emission in ALGaAs/GaAs high electron mobility transistors", "J. Appl. Phys.", 1991, pp. 529-531, vol. 70, No. 1.
Zanoni, E., et al., "Measurements of Avalanche Effects and Light Emission in Advanced Si and SiGe Bipolar Transistors", "Microelectronic Engineering", 1991, pp. 23-26, vol. 15.
Zdanowski, Marek, "Pulse operating up-converting phosphor LED", "Electron Technol.", 1978, pp. 49-61, vol. 11, No. 3.
Zhiming, Chen, et al., "Amorphous thin film white-LED and its light-emitting mechanism", "Conference Record of the 1991 International Display Research Conference", Oct. 1991, pp. 122-125.
The International Search Report mailed on Aug. 23, 2012 for PCT/US2011/063057.
International Preliminary Report on Patentability and Written Opinion of the International Searching Authority mailed on Aug. 23, 2012 for PCT/US2011/063057.
Non-Final Office Action dated Aug. 19, 2013 for U.S. Appl. No. 13/308,066.
Final Office Action dated Apr. 15, 2014 for U.S. Appl. No. 13/308,066.
Non-Final Office Action dated Jun. 2, 2014 for U.S. Appl. No. 13/941,236.
Notice of Allowance dated Nov. 21, 2014 for U.S. Appl. No. 13/941,236.
Non-Final Office Action dated Dec. 2, 2014 for U.S. Appl. No. 13/308,066.
Foreign Office Action dated Jun. 9, 2015 for Japanese Appln. No. 2013-542206.
1st Foreign Office Action dated Aug. 5, 2015 for Chinese Appln. No. 201180063987.6.
Final Office Action dated Jun. 8, 2015 for U.S. Appl. No. 13/308,066.
Foreign Office Action dated Feb. 23, 2016 for Japanese Appln. No. 2013-542206.

* cited by examiner

SECTION A-A

MATERIALS FOR PHOTOLUMINESCENCE WAVELENGTH CONVERTED SOLID-STATE LIGHT EMITTING DEVICES AND ARRANGEMENTS

CROSS-REFERENCE TO RELATED APPLICATION

This application is related to U.S. Provisional Application No. 62/001,596, filed on May 21, 2014 and entitled "Materials for Photoluminescence Wavelength Converted Solid-State Light Emitting Devices and Arrangements", which is hereby incorporated by reference in its entirety.

FIELD

This invention relates to materials for photoluminescence wavelength converted solid-state light emitting devices and arrangements. More specifically, though not exclusively, the invention concerns photoluminescence materials for manufacturing remote photoluminescence wavelength conversion components and photoluminescence wavelength converted solid-state light emitting device and methods of manufacture thereof.

BACKGROUND

White light emitting diodes (LEDs) are known in the art and are a relatively recent innovation. It was not until LEDs emitting in the blue/ultraviolet of the electromagnetic spectrum were developed that it became practical to develop white light sources based on LEDs. As is known, white light generating LEDs ("white LEDs") include a phosphor that is a photoluminescence material, which absorbs a portion of the radiation emitted by the LED and re-emits radiation of a different color (wavelength). For example the LED emits blue light and the phosphor re-emits yellow light. Alternatively the phosphor can emit a combination of green and red light, green and yellow or yellow and red light. The portion of the blue light emitted by the LED which is not absorbed by the phosphor mixes with the yellow light emitted to provide light which appears to the eye as being white. It is predicted that white LEDs could potentially replace incandescent light sources due to their long operating lifetimes, typically many 100,000 of hours, and their high efficiency. Already high brightness white LEDs are widely used in general lighting, street lighting, automotive applications, aeronautical applications, backlighting in LCD displays, laptops, tablets and cell phones.

The phosphor material that is used in the LED device is very carefully configured to have selected mixtures of different phosphor compositions at very particular loading percentages. This is because the exact color and quality of the light emissions from the LED device is highly dependent upon the type, quantity, and proportion of the phosphor compositions used in the device. Even slight variations in these parameters can cause a significant and visually perceptible change to the appearance of the light emissions from the device.

Difficulties may arise when phosphor manufacturers attempt to provide a consistent phosphor product to customers, where the phosphor product is a mixture of different phosphor materials in particle form at precisely calculated mixing percentages. The problem is that the process of storage and/or transporting of the phosphor product to the end-customer (e.g., the lighting manufacturer that incorporates the phosphor product into an LED device) may cause separation and settling of the phosphor particles to create mixture inconsistencies within the product.

To avoid these issues phosphor manufactures provide the customer with individual phosphors, which the customer then blends to achieve a desired color temperature of emitted light. However, many customers find it difficult to achieve consistent results with this approach since the end customers may not possess the correct equipment or expertise to achieve a mixture having a consistent distribution of the phosphor materials.

Therefore, there is a need for an improved approach to provide a phosphor product that avoids these and other problems.

SUMMARY OF THE INVENTION

Embodiments of the invention concern a photoluminescence material paste comprising a mixture of a light transmissive non-curable silicone fluid and particles of one or more inorganic photoluminescence materials, typically a phosphor material. In this application "curable" refers to the capability to which the silicone fluid is able to cross-link. For the silicone fluid to be curable requires it to be capable of at least 50%, preferably 70% or higher, cross-linking Conversely, "non-curable" is used in this specification to indicate that the silicone fluid is incapable of cross-linking, though it will be appreciated that it may be capable of some cross-linking though this will be very low and less than a few percent, typically less than 1%. This is in contrast to "partially-cured" materials, which refer to curable materials that are capable of being fully cured, but are only processed to a state that is less than fully cured.

The photoluminescence material paste, "phosphor paste", can then be mixed with a curable light transmissive silicone material, typically a two-part curable silicone material, to form a photoluminescence material compound. The photoluminescence material compound can be used in the manufacture of remote photoluminescence wavelength conversion components for solid-state, typically LED, light emitting devices and arrangements. Alternatively, the photoluminescence material compound can be deposited directly on the LED chips to manufacture photoluminescence wavelength converted solid-state light emitting devices.

In one embodiment, the phosphor paste is composed of a non-curable silicone fluid that comprises one part of a two-part curable silicone material. Such a non-curable silicone fluid is non-curable by itself without the other respective part of the two-part material.

There are a number of benefits of firstly mixing the photoluminescence material(s) with a non-curable silicone fluid and then adding the phosphor paste to a curable silicone material these include: 1) reducing clumping of the phosphor particles, 2) reducing separation or settling of different phosphor materials when multiple phosphor material are used having different densities, and 3) increasing shelf life of the product since the silicone fluid is non-curable.

According to an embodiment of the invention a photoluminescence material paste comprises a mixture of particles of two or more inorganic photoluminescence materials and a light transmissive non-curable silicone fluid, where each of the two or more inorganic photoluminescence materials have differing densities. In one embodiment, the non-curable silicone fluid is non-curable by itself and is also non-curable when mixed with another material such as a cross-linking agent and/or catalyst. Such non-curable silicone fluid can be termed "uncurable" and examples of such fluids include polydimethylsiloxane (PDMS) $CH_3[Si(CH_3)_2O]_nSi(CH_3)_3$ and polyphenylmethylsiloxane. Such silicone fluids are uncurable since they do not contain end groups (active sites) by which cross-linking can take place.

In another embodiment, the non-curable silicone fluid is not curable by itself but is curable when mixed with another material such as a cross-linking agent and/or catalyst. Examples of silicone fluids that are curable with the addition of another material include PDMS containing end groups such as for example hydride (—H), vinyl (—CH=$CH_2$), hydroxyl (—OH) and carbonyl (ROH) groups. Examples of suitable materials include polyphenylmethylsiloxane and polymethylhydrogensiloxane. In some embodiments, the non-curable silicone fluid can comprise one part of a two-part curable silicone material. A two-part curable silicone typically comprises a base polymer common to both parts with a cross-linking agent and catalyst being provided in a respective part of the two part composition.

The selection of non-curable silicone fluid may depend on the curable silicone material into which the paste is to be incorporated. For example, where the curable silicone material comprises a two-part dimethyl-based curable silicone such as for example a dimethyl-based vinylated and trimethylated silica, the non-curable silicone fluid can comprise an uncurable polydimethylsiloxane.

In some embodiments, the photoluminescence material(s) comprise phosphor material(s) having an average particle size (D50) of between about 5 μm and about 35 μm. In some applications the photoluminescence material(s) have an average particle size of between about 15 μm and about 20 μm.

The weight loading of the materials added to the non-curable silicone fluid to form the paste-like consistency of the photoluminescence material paste is selected to be high enough to reduce or substantially eliminate settling and/or separation of different density materials. In some embodiments such materials can comprise one or more photoluminescence materials by themselves, photoluminescence material(s) with light diffusive materials, and/or the inclusion of additional materials (e.g., anti-settling additives such as silica, refractive index additives, thermally conductive additives). In some embodiments, the solid weight loading of the materials added to the non-curable silicone fluid in the paste is in a range about 60% to about 95% with the solid loading depending on the viscosity of the non-curable silicone fluid. It will be appreciated that the non-curable silicone fluid should be compatible with the intended use of the photoluminescence material paste which can determine the composition and/or viscosity of the non-curable silicone fluid, and which may then affect the weight loading of the photoluminescence material. For example, where the photoluminescence material paste is to be premixed with a curable silicone material (typically a two-part curable silicone material) and the resultant photoluminescence material compound injection molded to form a remote photoluminescence wavelength conversion component, the weight loading of material(s) in the paste is in a range about 80% to about 90%. In one such embodiment the weight loading of materials in the paste is about 80% comprising 75.4% photoluminescence material(s) and 4.6% diffuser material. Where the photoluminescence material paste is to be used in a three stream injection molding process (one stream for the phosphor paste and a respective stream for parts A and B of the two-part curable silicone material), the photoluminescence material paste can be diluted by the addition of additional non curable silicone fluid such that the weight loading of the materials in the paste is about 40% to about 50% during injection molding. For such applications it can be beneficial to include in the photoluminescence material paste an anti-settling additive to avoid any problems of settling or sedimentation of materials in the paste during injection molding. In some embodiments where the photoluminescence material paste is to be premixed with a curable silicone material (typically two-part curable silicone material) and the resultant photoluminescence material compound dispensed directly onto an LED chip as part of an LED package (e.g., a Chip On Board COB device), the weight loading of material(s) in the photoluminescence material paste is about 88%. Typically for an LED package the paste does not include a diffuser material. Where the photoluminescence material paste in some embodiments is intended to be used as part of an encapsulation in a Chip On Glass (COG) light emitting device, the weight loading of material(s) in the paste is about 86% comprising 81% photoluminescence material and 4.7% diffuser.

The viscosity of the non-curable silicone fluid can be between about 500 and about 100,000 centistokes (cSt) in some embodiments. In some preferred embodiments the non-curable silicone fluid has a viscosity of about 5,000 cSt. Viscosity can depend on the viscosity of the curable silicone material it is intended to be used with.

To increase the CRI (Color Rendering Index) of a solid-state light emitting device and/or remote photoluminescence wavelength conversion component manufactured using the phosphor paste, the photoluminescence material preferably comprises a mixture of particles of a first and second inorganic photoluminescence materials. Typically, the first photoluminescence material has a first density and the second photoluminescence material has a second, different, density. A particular advantage of the invention is a reduction in a settling and/or separation of the first and second photoluminescence materials. The first and second photoluminescence materials can comprise particles with an average particle size that are substantially equal. Alternatively, the photoluminescence material paste can comprise a mixture of particles of a first photoluminescence material with a first particle size and a second photoluminescence material with a second, different, particle size.

The inorganic photoluminescence material can comprise a silicate-based phosphor, an aluminate-based phosphor, a nitride-based phosphor, sulfate-based phosphor, a YAG phosphor or mixtures thereof. In a preferred embodiment the first photoluminescence material comprises a green light emitting aluminate-based phosphor and the second photoluminescence material comprises a red light emitting nitride-based phosphor.

To reduce the quantity of photoluminescence material required to generate a selected color of emitted light, the photoluminescence material paste can further comprises particles of a light diffusive material. The inclusion of a light diffusive particle can further improve color uniformity of emitted light. Preferably, the particles of light diffusive material comprise nano-sized particles having an average particle size of between about 40 nm and about 500 nm. Particles of such size will scatter light differently depending on the light wavelength. The particle size of the light diffusive material can be selected to scatter excitation light more than photoluminescence generated light. Where the excitation light comprises blue light the particles of light diffusive material preferably have an average particle size of about 60 nm. The light diffusive material can comprise particles of Zinc Oxide (ZnO), titanium dioxide ($TiO_2$), barium sulfate ($BaSO_4$), magnesium oxide (MgO), silicon dioxide ($SiO_2$), aluminum oxide ($Al_2O_3$), zirconium dioxide ($ZrO_2$), or mixtures thereof.

Where the photoluminescence material paste is to be deposited directly on a LED chip, and to aid in the dissipation of heat, the photoluminescence material paste can further comprise particles of a thermally conductive material.

In some embodiments, a quantity of an anti-settling additive, such as silica, can be added to the photoluminescence material paste. The anti-settling additive is an agent that is placed within the mixture to maintain uniform distribution and consistency of the phosphor within the non-curable silicone fluid, particularly to prevent or inhibit settling during storage of the photoluminescence material paste. In some embodiments, the anti-settling additive comprises a suspension, rheological, and/or thickening agent and may comprise silica. This may be particularly useful to prevent settling in the final photoluminescence material composition when dispensed on a chip, e.g., silicone dioxide nano particles to increase viscosity and with regards to organic materials that have strong bonding of phosphor to two-part silicone material.

Refractive index additives may also be placed within the mixture to provide optimum light scattering properties for the photoluminescence material paste. In some cases, the refractive index additives are provided to promote index matching of the photoluminescence material paste and/or to increase the refractive index of the paste. This can be accomplished, for example, by selecting an additive (e.g., zirconium dioxide) having a desired refractive index, selecting a desired particle size for the additive (e.g., selected with regards to a given wavelength or wavelength range), and to then select a desired percentage loading of that additive within the paste. For example, in some embodiments, refractive index additives may be included to match the refractive index n to silicone (phosphor n=2.0, silicone n=1.4/1.5), e.g., by using nano zirconium dioxide particles.

As well as providing a photoluminescence material paste, some embodiments of the invention find application in the manufacture of light diffusive components (that may not contain a photoluminescence material). According to an embodiment of the invention a light diffusive material paste comprises: a mixture of a light transmissive non-curable silicone fluid and particles of light diffusive material. The light diffusive material paste, "diffusive paste", can then be mixed with a curable light transmissive silicone material (typically a two-part curable silicone material) and the resulting light diffusive material compound used in the manufacture of light diffusive optical components or a light diffusive portion of a remote photoluminescence wavelength conversion component. The non-curable silicone fluid can comprise a linear polydimethylsiloxane (PDMS), phenylmethyl polysiloxane or a methylhydrogen polysiloxane. In other embodiments the non-curable silicone fluid can comprise one part of a two-part curable silicone material.

Preferably, the light diffusive material comprises nano-sized particles having an average particle size of between about 40 nm and about 100 nm. Particles of such size will scatter light differently depending on the wavelength of light. Where the light diffusive component is to be used in a blue light based LED system the particles of light diffusive material preferably have an average particle size of about 60 nm. The light diffusive material can comprise particles of Zinc Oxide (ZnO), titanium dioxide ($TiO_2$), barium sulfate ($BaSO_4$), magnesium oxide (MgO), silicon dioxide ($SiO_2$), aluminum oxide ($Al_2O_3$), zirconium dioxide ($ZrO_2$) or mixtures thereof.

The weight loading of the light diffusive material in the paste can be in a range 10% to 60% depending on the intended method of manufacture of the light diffusive component. For example where a 2-D printing process (e.g., screen printing) is to used to deposit the light diffusive material the weight loading of the particles of the light diffusive material in the paste is in a range about 50% to about 60%. Where injection molding is to be used to manufacture the light diffusive component, the weight loading of light diffusive material to in the paste is in a range about 10% to about 20%.

The viscosity of the curable silicone material depends on the intended method of manufacture of the photoluminescence wavelength conversion component and/or light diffusive component. For example where the component is to be manufactured using injection molding the curable silicone material can have a viscosity of between about 100,000 and about 1,500,000 cSt.

The inventors have discovered that the photoluminescence material paste of the invention can be mixed in high proportions with a curable silicone material and the resulting photoluminescence material compound is still curable. Accordingly the method in some embodiments can comprise mixing the photoluminescence paste with a curable silicone material in a quantity up to about 70% by weight in the photoluminescence material compound. In one embodiment the weight ratio of photoluminescence material paste is about 5 to 2 of photoluminescence material paste to curable silicone material. The curable silicone material can comprise a dimethyl-based two-part curable silicone.

According to a another aspect of the invention a method of manufacturing a remote photoluminescence wavelength conversion component comprises: forming a photoluminescence material compound by mixing a selected quantity of the photoluminescence material paste with a selected quantity of a curable silicone material, wherein the photoluminescence paste comprises a first inorganic photoluminescence material having a first density, a second inorganic photoluminescence material having a second density and a light transmissive non-curable silicone fluid, the first inorganic photoluminescence material and the second inorganic photoluminescence material being substantially homogenously distributed within the light transmissive non-curable silicone fluid, and a weight loading of the first and second photoluminescence materials in the photoluminescence paste is in a range of about 60% to about 95%; forming the photoluminescence component by one method selected from the group consisting of: molding the photoluminescence component with the photoluminescence material compound; depositing the photoluminescence material compound on a light transmissive substrate and depositing the photoluminescence material compound on a light reflective substrate; and at least partially curing the photoluminescence material compound.

According to another aspect of the invention a method of manufacturing a solid-state light emitting device, comprises: forming a photoluminescence material compound by mixing a selected quantity of the photoluminescence material paste with a selected quantity of a curable silicone material, wherein the photoluminescence paste comprises a first inorganic photoluminescence material having a first density, a second inorganic photoluminescence material having a second density and a light transmissive non-curable silicone fluid, the first inorganic photoluminescence material and the second inorganic photoluminescence material being substantially homogenously distributed within the light transmissive silicone fluid, and a weight loading of the first and second photoluminescence materials in the photoluminescence paste is in a range of about 60% to about 95%; dispensing the photoluminescence material compound onto a solid-state light source; and at least partially curing the photoluminescence material compound.

The method of the invention finds particular application where the solid-state light emitting device comprises: a packaged LED chip, an LED chip on a light transmissive substrate, an LED Chip On Glass (COG) or an LED Chip On Board (COB).

According to further aspects of the invention there are provided a remote photoluminescence wavelength conversion component and photoluminescence wavelength converted solid-state light emitting devices manufactured using the photoluminescence material paste and methods of the invention.

BRIEF DESCRIPTION OF THE DRAWINGS

In order that the present invention is better understood a photoluminescence material paste and methods of manufacture of photoluminescence wavelength conversion and photoluminescence wavelength converted solid-state light emitting device in accordance with the invention will now be described, by way of example only, with reference to the accompanying drawings in which like reference numerals are used to denote like parts, and in which.

DETAILED DESCRIPTION OF THE INVENTION

Embodiments of the invention concern a photoluminescence material paste comprising a mixture of a light transmissive non-curable silicone fluid and particles of an inorganic photoluminescence material, typically a phosphor material. The photoluminescence material paste, "phosphor paste", can then be mixed with a curable light transmissive silicone material, typically a two-part curable silicone material, to form a photoluminescence material compound. In one embodiment, the phosphor paste can be formed as one part of a two-part curable silicone material rather than being separate from and then being added to the two-part curable silicone material.

The photoluminescence material compound can be used in the manufacture of remote photoluminescence wavelength conversion components for solid-state, typically LED, light emitting devices and arrangements. Alternatively, the photoluminescence material compound can be deposited directly on the LED chips to manufacture photoluminescence wavelength converted solid-state light emitting devices.

Figure 1:
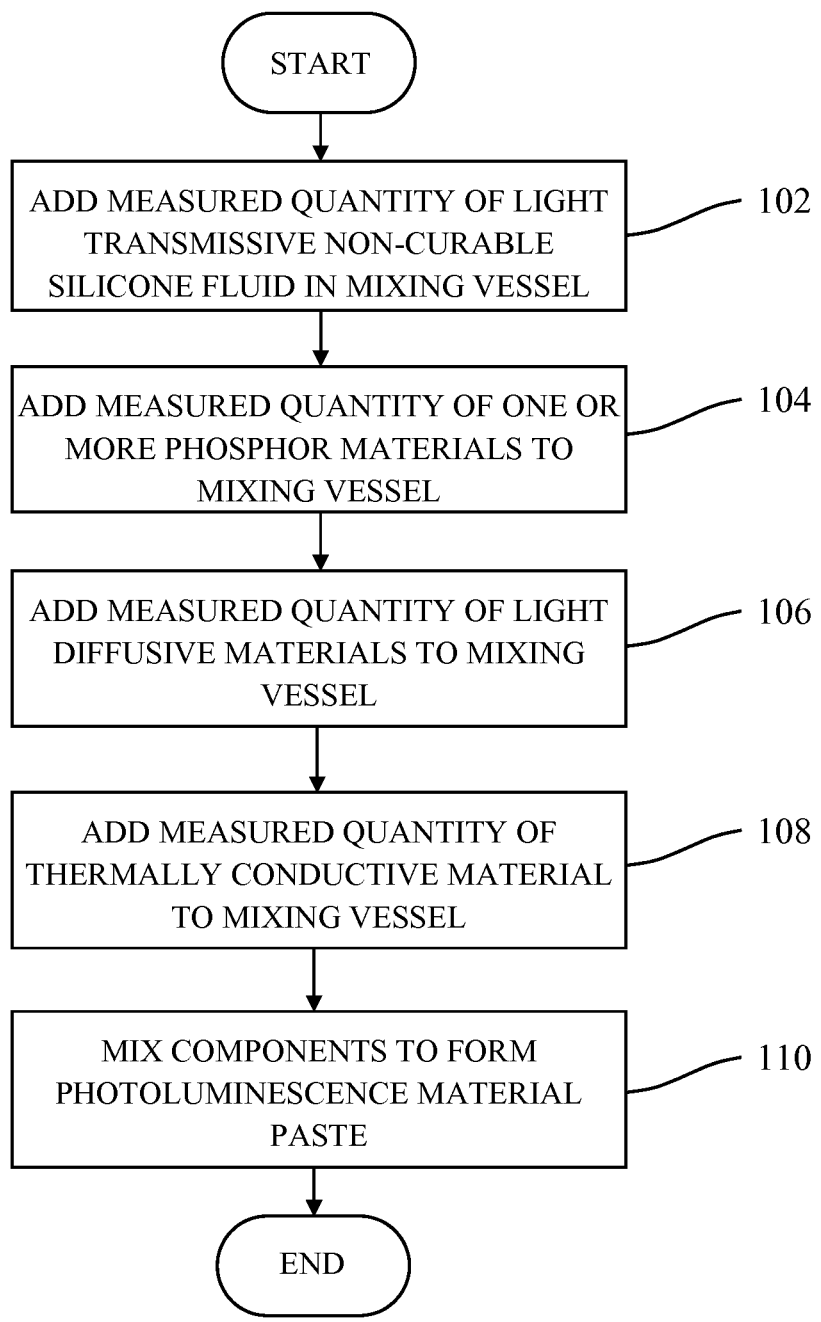
FIG. 1 is a flow chart of an example approach to manufacturing a photoluminescence material paste in accordance with an embodiment of the invention.

FIG. 1 shows a flow chart of an approach to manufacture a photoluminescence material paste according to some embodiments of the invention. The first step at 102 is to add a measured quantity of a light transmissive non-curable silicone fluid to a mixing vessel as a carrier material. Any suitable non-curable silicone fluid can be used in embodiments of the invention. In this application "curable" refers to the capability to which the silicone fluid is able to cross-link. For the silicone fluid to be curable requires it to be capable of at least 50%, preferably 70% or higher, cross-linking Conversely, "non-curable" is used in this specification to indicate that the silicone fluid is incapable of cross-linking, though it will be appreciated that it may be capable of some cross-linking though this will be very low and less than a few percent, typically less than 1%. It will be appreciated that non-curable can encompass a material that is significantly resistant to curing under normal environmental conditions for such materials (c.f. elevated temperatures or exposure to high levels of U.V. for extended periods of time). This is in contrast to "partially-cured" materials, which refer to curable materials that are capable of being fully cured, but are only processed to a state that is less than fully cured.

In one embodiment, the non-curable silicone fluid is not curable by itself but is curable when mixed with another material such as a cross-linking agent and/or catalyst. Examples of silicone fluids that are curable with the addition of another material include PDMS containing end groups such as for example hydride (—H), vinyl (—CH=CH$_2$), hydroxyl (—OH) and carbonyl (ROH) groups. Examples of suitable materials include polyphenylmethylsiloxane and polymethylhydrogensiloxane. In some embodiments, the non-curable silicone fluid comprises one part of a two-part curable silicone material. Such a non-curable silicone fluid is non-curable by itself without the other respective part of the two-part material.

In another embodiment, the non-curable silicone fluid is non-curable by itself and is also non-curable when mixed with another material such as a cross-linking agent and/or catalyst. Such non-curable silicone fluid can be termed "uncurable" and examples of such fluids include polydimethylsiloxane (PDMS) CH$_3$[Si(CH$_3$)$_2$O]$_n$Si(CH$_3$)$_3$ and polyphenylmethylsiloxane. Such silicone fluids are uncurable since they do not contain end groups (active sites) by which cross-linking can take place.

In summary the non-curable silicone fluid can be either a) a silicone fluid that is not curable by itself and is not curable when mixed with another material or b) a silicone fluid that is not curable by itself and is curable when mixed with a another material. The reason for using a non-curable silicone fluid is to avoid the "short shelf life" problem, since a curable carrier material may result in the premature curing of the photoluminescence paste during storage/transport.

The selection of non-curable silicone fluid may depend on the curable silicone material into which the paste is to be incorporated. For example, where the curable silicone material comprises a two-part dimethyl-based curable silicone such as for example a dimethyl-based vinylated and trimethylated silica, the non-curable silicone fluid can comprise an uncurable polydimethylsiloxane.

Any suitable viscosity can be selected for the non-curable silicone fluid, appropriate to promote even distribution of materials in the carrier fluid while minimizing the effects of particle settling. As described in more detail below, very small particles (e.g., nano-sized light diffusive materials)

may be included (mixed with) with the photoluminescence material, and an appropriately high viscosity level may be desirable to avoid clumping of such materials. In some embodiments, the viscosity of the non-curable silicone fluid is between about 500 and about 100,000 centistokes (cSt). In preferred embodiments the non-curable silicone fluid has a viscosity of about 60,000 centistokes (cSt).

The next step at 104 is to add a measured quantity of one or more photoluminescence materials, such as phosphor materials. In some embodiments, the inorganic photoluminescence material comprises a phosphor material having an average particle size (D50) of between about 5 µm and about 35 µm. In some applications the particles of photoluminescence material have an average particle size of between about 15 µm and about 20 µm. According to an embodiment of the invention, two or more photoluminescence materials are added to the mixture, where each of the two or more photoluminescence materials has different densities.

The weight loading of the materials added to the silicone fluid to form the paste-like consistency of the photoluminescence material compound is selected to be high enough to reduce or substantially eliminate settling and/or separation of different density materials within the paste. In some embodiments such materials can comprise one or more photoluminescence materials by themselves, photoluminescence material(s) with diffuser materials, and/or the inclusion of additional materials (e.g., anti-settling additives, refractive index additives, thermally conductive additives). Typically the weight loading of the materials added to the silicone fluid in the paste is in a range about 60% to about 95% with the solid loading depending on the viscosity of the silicone fluid. It will be appreciated that silicone fluid needs to be compatible with the intended use of the photoluminescence material paste which can determine the composition and/or viscosity of the silicone fluid, and which may then affect the weight loading of the photoluminescence material. For example, in some embodiments the weight loading of photoluminescent materials in the paste is in a range about 80% to about 90% or in a range about 70% to about 80%.

For example, where the photoluminescence material paste is to be premixed with a two-part curable silicone material and the resultant photoluminescence material compound injection molded to form a remote photoluminescence wavelength conversion component, the weight loading of material(s) in the paste is in a range about 80% to about 90%. In embodiments, where the photoluminescence material paste is to be used in a three stream (one stream for the phosphor paste and a respective stream for parts A and B of the two-part curable silicone fluid) injection molding process the weight loading of the materials in the paste is about 80%. In one such embodiment the weight loading of materials in the paste is about 80% comprising 75.4% photoluminescence material(s) and 4.7% diffuser (Table 1).

In embodiments where the photoluminescence material paste is to be premixed with a two-part curable silicone material and the resultant photoluminescence material compound dispensed directly onto an LED chip as part of an LED package (e.g., a Chip On Board COB device), the weight loading of material(s) in the photoluminescence material paste is about 88%. Typically for an LED package the paste does not include a diffuser material (Table 1).

Where the photoluminescence material paste is intended to be used as an encapsulation in a chip on glass (COG) light emitting device, the weight loading of material(s) in the paste is about 85% comprising 81% photoluminescence material and 4% diffuser.

TABLE 1

Photoluminescence material paste composition by intended application

| Application | Weight loading of materials in paste (%) |
|---|---|
| Injection molding | 80 = 75.4 photoluminescence material(s), 4.7% diffusive material |
| LED package (e.g. COB) | 88 = photoluminescence material(s) |
| Chip On Glass (COG) | 85 = 81% photoluminescence material(s), 4% diffusive material |

The viscosity of the non-curable silicone fluid can have a viscosity of between about 500 and about 100,000 centistokes (cSt). In preferred embodiments the non-curable silicone fluid has a viscosity of about 5,000 centistokes (cSt). Viscosity can depend on the viscosity of the curable silicone material it is intended to be used with.

To increase the CRI (Color Rendering Index) of a solid-state light emitting device and/or remote photoluminescence wavelength conversion component manufactured using the phosphor paste, the photoluminescence material preferably comprises a mixture of particles of a first and second inorganic photoluminescence materials. Typically, the first photoluminescence material has a first density and the second photoluminescence material has a second, different, density. A particular advantage of the invention is a reduction in a settling and/or separation of the first and second photoluminescence materials. The first and second photoluminescence materials can comprise particles with an average particle size that are substantially equal. Alternatively, the photoluminescence material paste can comprise a mixture of particles of a first photoluminescence material with a first particle size and a second photoluminescence material with a second, different, particle size.

The inorganic photoluminescence material can comprise a silicate-based phosphor, an aluminate-based phosphor, a nitride-based phosphor, sulfate-based phosphor, a YAG phosphor or mixtures thereof. In a preferred embodiment the first photoluminescence material comprises a green light emitting aluminate-based phosphor and the second photoluminescence material comprises a red light emitting nitride-based phosphor. The green light emitting aluminate-based phosphor can comprise a garnet-based phosphor as taught in U.S. Pat. No. 8,529,791 entitled "Green-Emitting, Garnet-Based Phosphors in General and Backlighting Applications" which is hereby incorporated in its entirety. Such a green emitting phosphor comprises a cerium-activated, green-emitting lutetium aluminate phosphor consisting of lutetium, cerium, at least one alkaline earth metal, aluminum, oxygen, and at least one halogen, wherein the phosphor is configured to absorb excitation radiation having a wavelength ranging from about 380 nm to about 480 nm, and to emit light having a peak emission wavelength ranging from about 500 nm to about 550 nm. The red light emitting nitride-based phosphor comprises a as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_a Sr_b Si_c Al_d N_e Eu_f$, wherein: M is Ca, and $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein $a+b+f > 2+d/v$ and v is the valence of M. Alternatively the red-emitting phosphor comprises a red light emitting nitride-based phosphor comprises a as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/}$ v) $M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x < 0.4$, and wherein said red-emitting phosphor has the general crystalline structure of $M'_2Si_5N_8$:RE, Al substitutes for Si within said general crystalline structure, and M is located within said general crystalline structure substantially at the interstitial sites.

As an optional step, at 106, a measured quantity of a light diffusive material can be added so that the photoluminescence material paste can further comprises particles of a light diffusive material. The loading of particles of the light diffusive material in the photoluminescence material paste can be in a range 0.1% to 10%. One reason for including the light diffusive material is to reduce the quantity of photoluminescence material required to generate a selected color of emitted light. The inclusion of particles of a light diffusive material can further improve color uniformity of emitted light. Preferably, the particles of light diffusive material comprise nano-sized particles having an average particle size of between about 40 nm and about 100 nm. Particles of such size will scatter light differently depending on the light wavelength. The particle size of the light diffusive material can be selected to scatter excitation light more than photoluminescence generated light. Where the excitation light comprises blue light the particles of light diffusive material preferably have an average particle size of about 60 nm. The light diffusive material can comprise particles of Zinc Oxide (ZnO), titanium dioxide ($TiO_2$), barium sulfate ($BaSO_4$), magnesium oxide (MgO), silicon dioxide ($SiO_2$), aluminum oxide ($Al_2O_3$), zirconium dioxide ($ZrO_2$) or mixtures thereof.

As another optional step, at 108, a measured quantity of thermally conductive material can be added to the photoluminescence material paste. This is useful, for example, where the photoluminescence material paste is to be deposited directly on a LED chip and the thermally conductive material is used to aid in the dissipation of heat. Any suitable thermally conductive material can be employed as desired, depending upon the specific needs of the application to which the invention is employed. For example, thermally conductive plastics or thermally conductive additives may be used included within the photoluminescence material paste.

In some embodiments, a quantity of an anti-settling additive, such as silica, can be added to the material paste. The anti-settling additive is an agent that is placed within the mixture to maintain uniform distribution and consistency of the phosphor within the silicone fluid, particularly to prevent or inhibit settling during storage of the photoluminescence material paste. In some embodiments, the anti-settling additive comprises a suspension, rheological, and/or thickening agent.

Refractive index additives may also be placed within the mixture to provide optimum light scattering properties for the photoluminescence material paste. In some cases, the refractive index additives are provided to promote index matching of the photoluminescence material paste and/or to increase/decrease the refractive index of the paste. This can be accomplished, for example, by selecting an additive (e.g., titanium dioxide) having a desired refractive index, selecting a desired particle size for the additive (e.g., selected with regards to a given wavelength or wavelength range), and to then select a desired percentage loading of that additive within the paste.

Once all of the components have been placed into the mixing vessel, the components are mixed together at 110 to form the photoluminescence material paste. Any appropriate mixing/blending technique can be employed to mix the components.

In an exemplary example of a phosphor paste in accordance with the invention the non-curable silicone fluid comprises a Xiameter® PMX-200 silicone fluid, which is a linear polymethyl siloxane $(CH_3)_3SiO[SiO(CH_3)_2]_nSi(CH_3)_3$ with a viscosity of 5,000 centistokes (cSt), the phosphor material comprises a mixture of and particles of nano-diffuser. The weight loading of phosphor/diffuser material to silicone fluid is about 80% to 88% depending on intended use of the paste (Table 1).

According to another aspect of the invention, a method is described for manufacturing a remote photoluminescence wavelength conversion component. Even though the photoluminescence material paste is itself non-curable, it can be used in conjunction with a separate curable material to form the final optical product. In this approach, the photoluminescence material paste is mixed with a selected quantity of a curable silicone material to form a photoluminescence compound which can then be cured.

Figure 2:
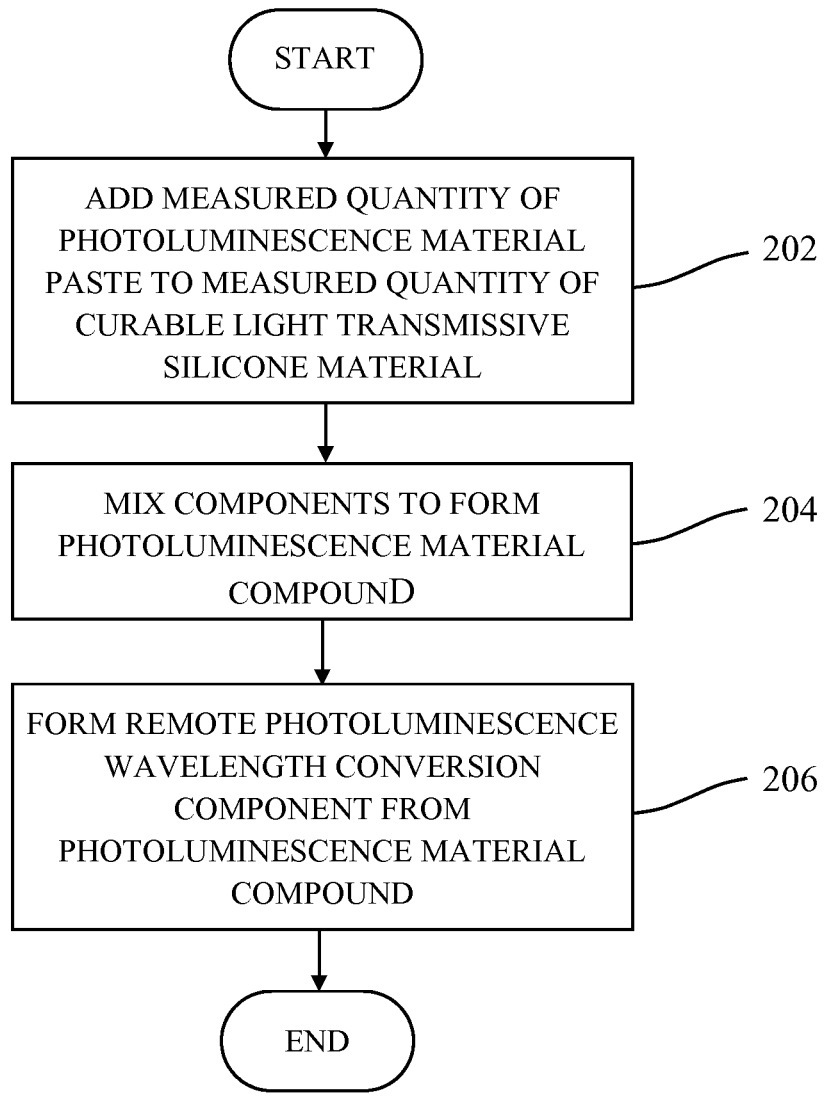
FIG. 2 is a flow chart of an example approach to manufacturing a remote photoluminescence wavelength conversion component in accordance with an embodiment of the invention.

FIG. 2 shows a flowchart of an approach that can be taken according to some embodiments for manufacturing a remote photoluminescence wavelength conversion component. The first step at 202 is to add a selected quantity of the photoluminescence material paste to a curable silicone fluid. In some embodiments, the curable silicone fluid can comprise a two-part curable silicone material such as a dimethyl-based two-part curable silicone. An example of a suitable two-part curable silicone is a dimethyl-based vinylated and trimethylated silica such as for example Dow Corning® OE-6370 HF when the phosphor paste carrier comprises a polymethyl siloxane.

The viscosity of the curable silicone material depends on the intended method of manufacture of the photoluminescence wavelength conversion component. For example where the component is to be manufactured using injection molding the curable silicone fluid has a viscosity of between about 100,000 and about 1,500,000 centistokes (cSt).

The inventors have discovered that the photoluminescence material paste of the invention can be mixed in high proportions with the curable silicone fluid and the resulting photoluminescence material compound is still curable. Accordingly the method can comprise mixing the photoluminescence paste with the curable silicone fluid in a quantity up to about 70% by weight in the photoluminescence material compound that is a weight ratio of about 5 to 2 of photoluminescence material paste to curable silicone material.

The components are then mixed at 204 to form the photoluminescence material compound. Next, the photoluminescence wavelength conversion component (e.g., for remote phosphor applications) is formed from the photoluminescence material compound into any desirable shape. This shaping can be performed, for example, by molding the photoluminescence compound. Thereafter, at 206, the shaped photoluminescence material compound is cured (either fully or partially cured), e.g., by using application of heat, UV light, or appropriate chemicals.

Figure 8A:
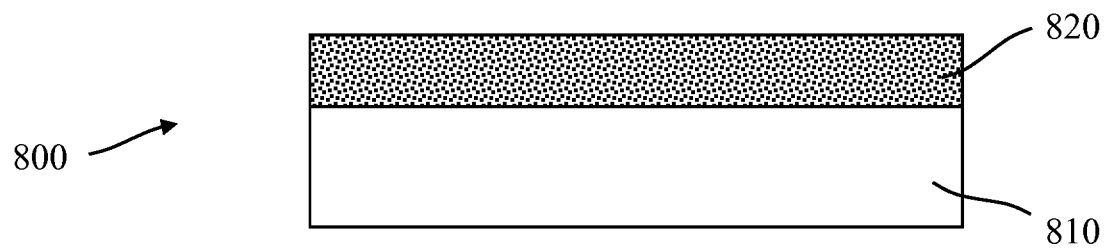
FIGS. 8A-8C show schematic views of remote photoluminescence wavelength conversion component in accordance with embodiments of the invention which respectively show a light transmissive, light reflective and molded remote photoluminescence wavelength conversion components.
Figure 8B:
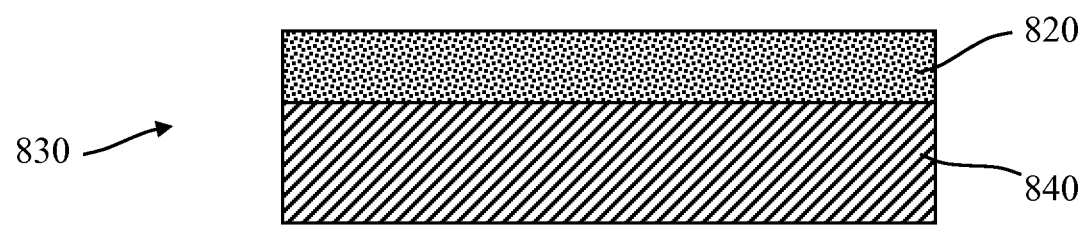
Figure 8C:
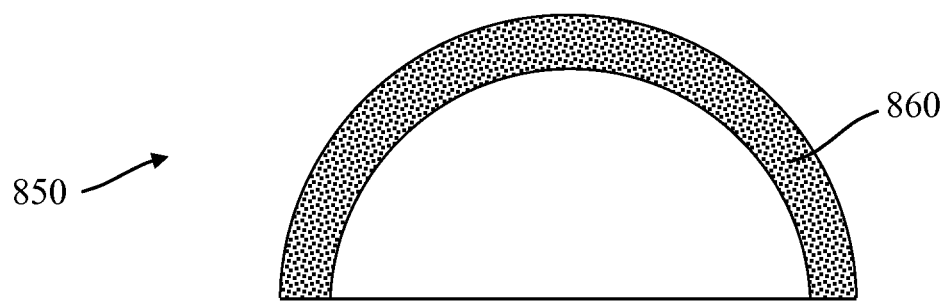

FIGS. 8A-8C show illustrative examples of remote photoluminescence wavelength conversion component manufactured in accordance with the method described in conjunction with FIG. 2. The figures respectively show a light transmissive photoluminescence wavelength conversion component 800, a light reflective photoluminescence wavelength conversion component 830 and a molded remote photoluminescence wavelength conversion component 860.

The light transmissive component 800 comprises a light transmissive substrate 810 with a layer of photoluminescence material compound 820 deposited on one or more faces (FIG.

8A). As indicated, the light transmissive substrate 810 can be planar or alternatively 3-D in form and can comprise glass or a polymer material.

The light reflective component 830 comprises a light reflective substrate 840 with a layer of photoluminescence material compound 820 deposited on a face thereof (FIG. 8B). As indicated, the light reflective substrate 840 can be planar or alternatively 3-D in form and can comprise any light reflective material such as a metal or a polymer material.

The molded component 850 comprises a component which is fabricated entirely from the photoluminescence material compound 860 (FIG. 8C). As indicated, the molded component can comprise a hemispherical shell or other shapes depending on intended application. For example the component can be injection molded. The correlated color temperature (CCT) and/or color rendering index (CRI) of light generated by such a component depends on the wall thickness of the component and the loading of photoluminescence within the component wall. For example for a component with a wall thickness of about 1.5 mm when using a two-part silicone material with a viscosity of 60,000 centistokes (cSt), the weight loading of the about 3%-10% photoluminescence material paste (Table 1) in the photoluminescence material compound (photoluminescence material paste+two-part silicone material) depending on the required CCT and CRI. In embodiments, where the photoluminescence material paste is to be used in a three stream injection molding process the weight loading of the photoluminescence material paste in the photoluminescence material compound is about 5% for a 6000K component.

Figure 3:
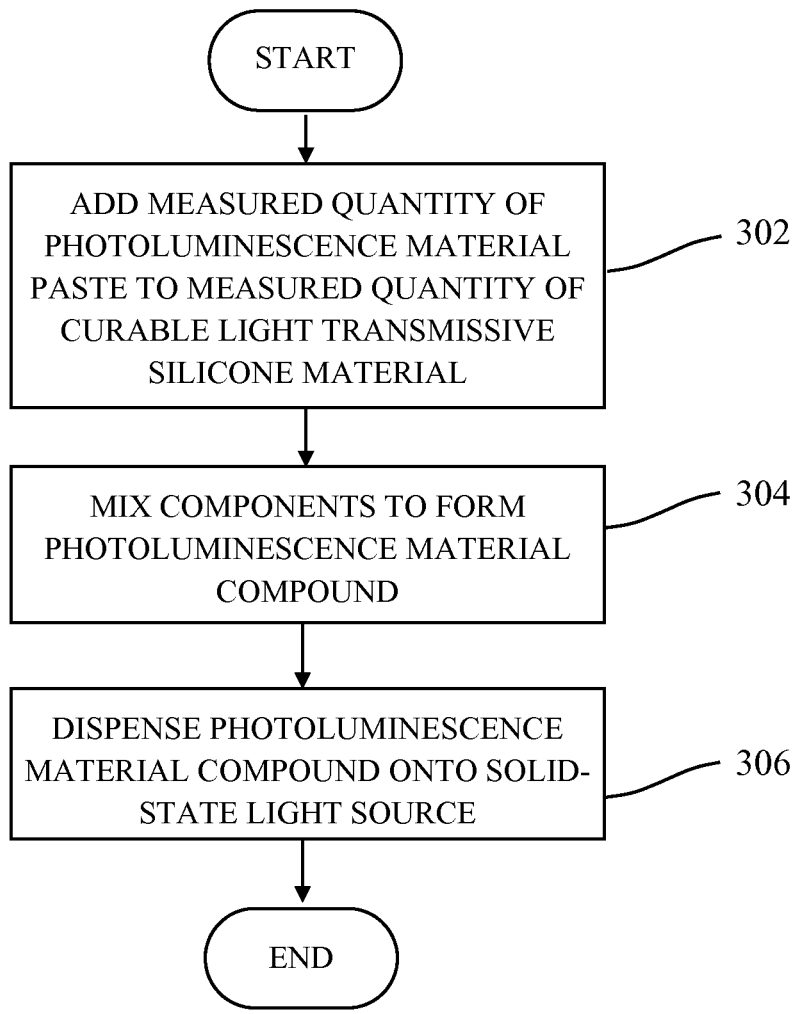
FIG. 3 is a flow chart of an example approach to manufacture a photoluminescence wavelength converted solid-state light emitting device in accordance with an embodiment of the invention.

FIG. 3 shows a flowchart of an approach that can be taken according to some embodiments for manufacturing a photoluminescence wavelength converted solid-state light emitting device. The first step at 302 is to add a selected quantity of the photoluminescence material paste to a curable silicone material. In some embodiments, the curable silicone material can comprise a dimethyl-based two-part curable silicone.

The viscosity of the curable silicone material depends on the intended method of manufacture of the photoluminescence wavelength conversion component. For example where the component is to be manufactured by dispensing the photoluminescence material compound, the curable silicone material has a viscosity of between about 5,000 and about 10,000 centistokes (cSt).

The components are then mixed at 304 to form the photoluminescence material compound. Next, the photoluminescence wavelength conversion component is dispensed onto a solid-state light source. Thereafter, at 306, the dispensed photoluminescence material compound is cured (either fully or partially cured), e.g., by using application of heat, UV light, or appropriate chemicals.

The method of the invention finds particular application where the solid-state light source comprises: a packaged LED chip, an LED chip on a light transmissive substrate, an LED Chip On Glass (COG) or an LED Chip On Board (COB).

FIGS. 4, 5A, 5B, 6, 7A and 7B provide illustrative examples for this process of manufacturing a light emitting device in accordance with the method described in conjunction with FIG. 3.

Figure 4:
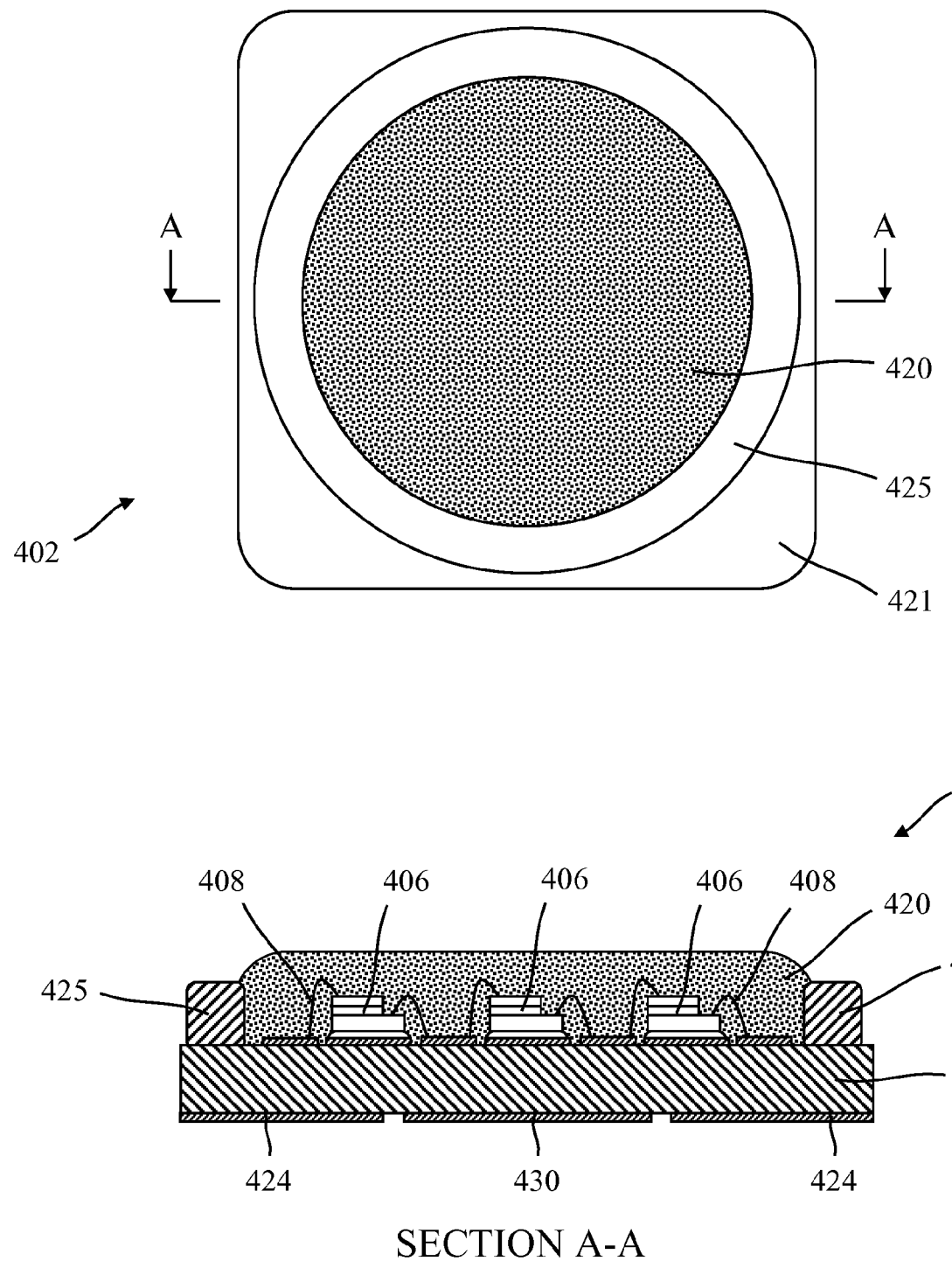
FIG. 4 shows schematic plan view and sectional view of a COB (Chip On Board) light emitting device in accordance with an embodiment of the invention.

FIG. 4 shows schematic plan view and sectional view of a COB (Chip On Board) light emitting device 402 in accordance with an embodiment of the invention. Here, an entire array of packaged LED chips 406 is placed within a packaging structure. The array of LEDs 406 is placed on the circuit board 421 between annular walls 425. In some embodiments, the circuit board 421 comprises a MCPCB (Metal Core Printed Circuit Board). The metal core base of the circuit board 421 is mounted in thermal communication with a heat-sink pad 430, e.g., with the aid of a thermally conducting compound such as for example a material containing a standard heat sink compound containing beryllium oxide or aluminum nitride. Bond wires 408 provide the connection paths from leads to each LED chip 406. Contact pads 424 provide electrical conductivity from the COB LED structure 402 to external control electronics.

An encapsulant 420 is deposited over and around the entire array of packaged LED chips. The encapsulant 420 comprises the inventive photoluminescence material paste that was mixed with a curable light transmissive silicone material to form a photoluminescence material compound.

Figure 5A:
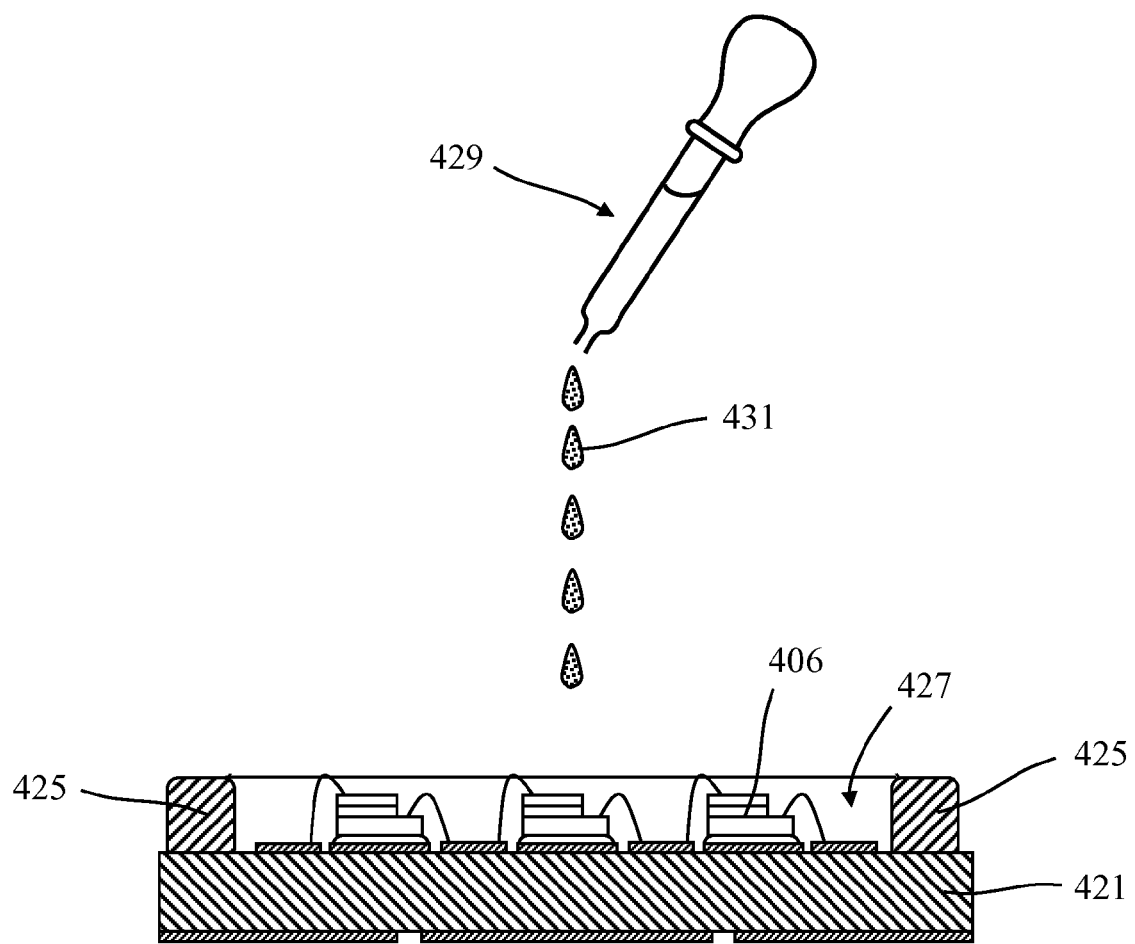
FIGS. 5A and 5B is a schematic of a method of manufacture of the COB light emitting device of FIG. 4 in accordance with an embodiment of the invention.
Figure 5B:
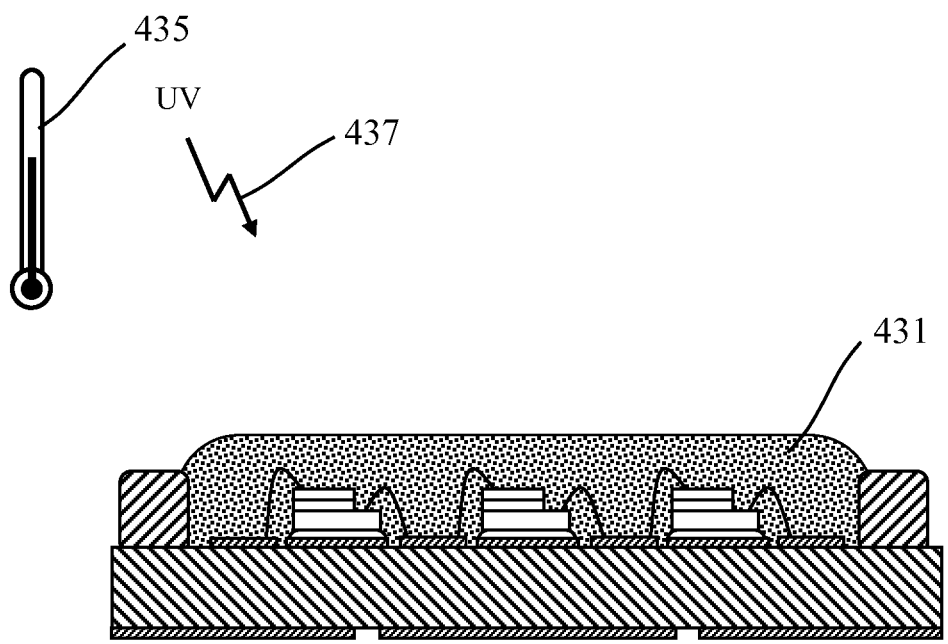

FIGS. 5A and 5B is a schematic of a method of manufacture of the COB light emitting device of FIG. 4 in accordance with an embodiment of the invention. Here, the annular walls 425 of the package structure define a cylindrical cavity 427 containing the array of LEDs 406. As shown in FIG. 5A, a dispenser 429 is used to dispense a selected quantity of the photoluminescence material compound 431 within the cylindrical cavity 427. The photoluminescence material compound 431 comprises the photoluminescence material paste combined with a curable silicone material, e.g., where the curable silicone material is a dimethyl-based two-part curable silicone. The viscosity of the curable silicone material has a viscosity of, for example, between about 5,000 and about 10,000 centistokes (cSt). Thereafter, as shown in FIG. 5B, the dispensed photoluminescence material compound 431 is cured (either fully or partially cured), e.g., by using application of heat 435, UV light 437, and/or appropriate chemicals. The correlated color temperature (CCT) and/or color rendering index (CRI) of light generated by depends on the thickness of the photoluminescence encapsulation 420 and the loading of photoluminescence material(s) within the encapsulation. For example when using a two-part curable silicone material with a viscosity of 5,000 cSt the weight loading of the about 15%-40% photoluminescence material paste (Table 1) in the photoluminescence material compound depending on the required CCT and/or CRI. As noted above the photoluminescence material paste typically does not include a light diffusive material for LED packaged devices.

While this example provides an illustration explicitly directed to a COB embodiment, it is noted that this technique is applicable without limitation to any packaged LED structure, whether or not containing a COB structure. For example, this same approach can be used to manufacture a single chip LED structure with the photoluminescence material paste.

Figure 6:
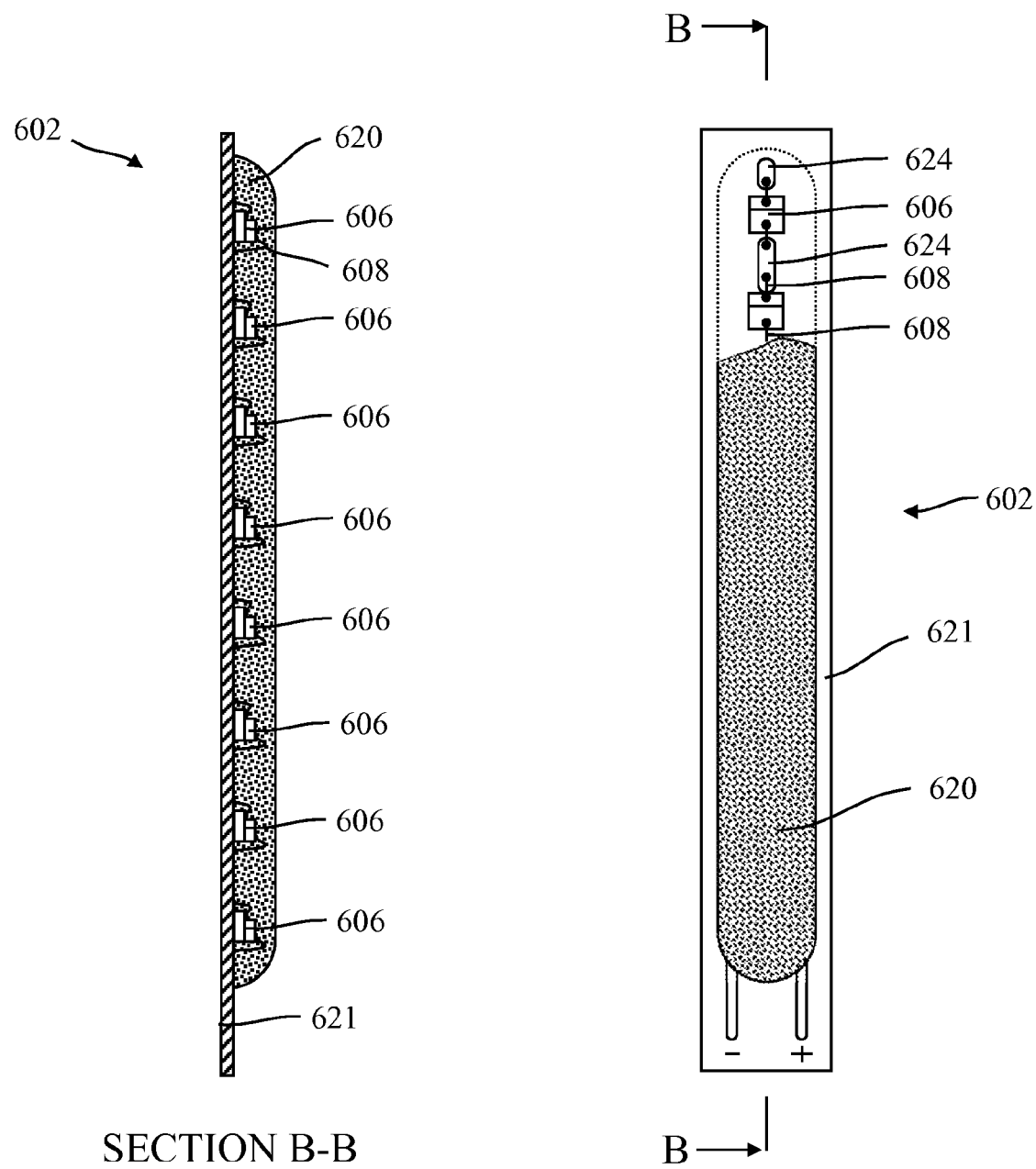
FIG. 6 shows schematic plan and section views of a COG (Chip On Glass) light emitting device in accordance with an embodiment of the invention.

FIG. 6 shows schematic plan and section views of a COG (Chip On Glass) light emitting device in accordance with an embodiment of the invention. The COG (Chip On Glass) light emitting device 602 includes an array of LEDs 606 that are aligned and mounted along a glass substrate 621. The array of LED chips 606 is bonded to the glass substrate 621. Bond wires 608 are affixed to the LED chips 606, where the other end of the bond wires 608 are attached to contact pads 624.

An encapsulant 620 is deposited over and around the array of LED chips 606. The encapsulant 420 comprises the inventive photoluminescence material paste that was mixed with a two-part curable light transmissive silicone fluid to form a photoluminescence material compound.

Figure 7A:
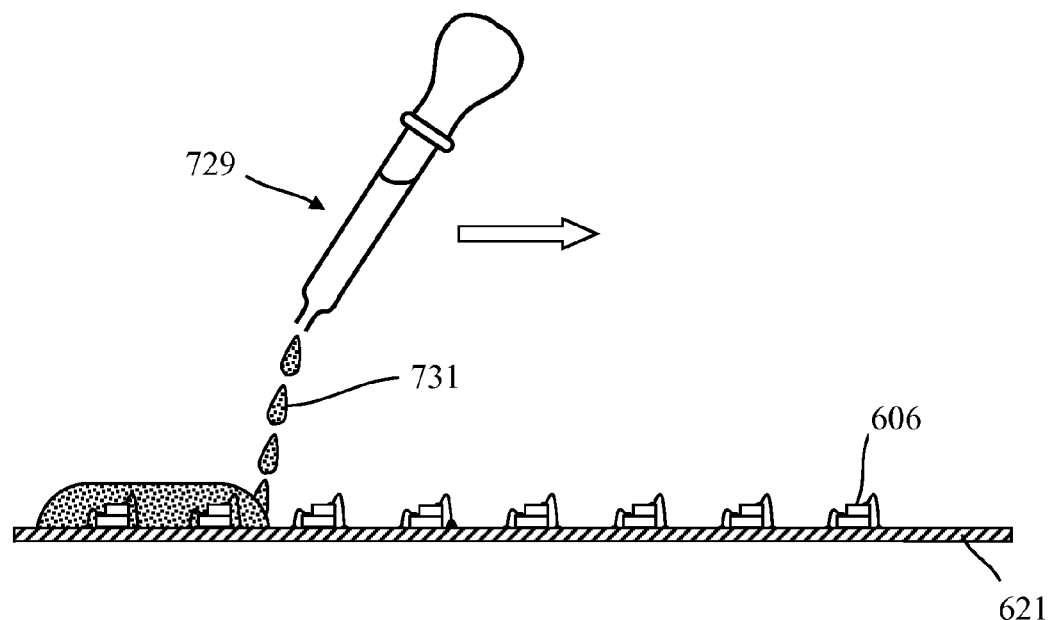
FIGS. 7A and 7B is a schematic of a method of manufacture of the COG light emitting device of FIG. 6 in accordance with an embodiment of the invention.
Figure 7B:
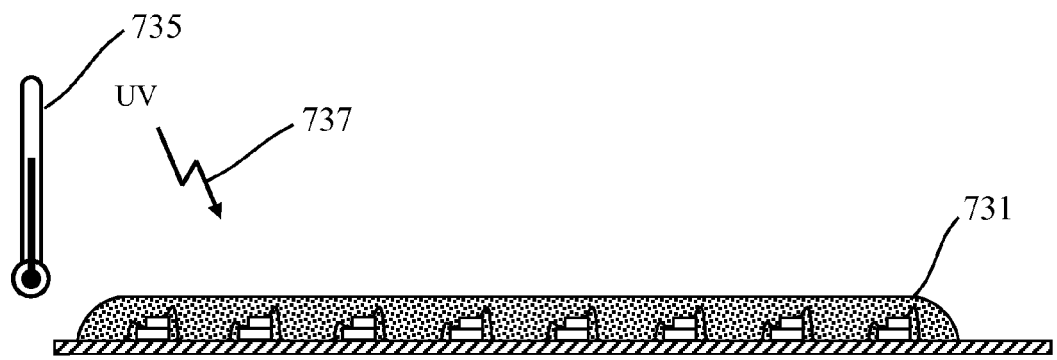

FIGS. 7A and 7B is a schematic of a method of manufacture of the COG light emitting device of FIG. 6 in accordance with an embodiment of the invention. As shown in FIG. 7A, a dispenser 729 is employed to dispense a quantity of the photoluminescence material compound 731 over and around the array of LED chips 606. If the photoluminescence material compound 731 has a sufficient level of viscosity, then the photoluminescence material compound 731 can be applied directly over the array of LED chips 606 without requiring the use of a surrounding form. However, if the photoluminescence material compound 731 does not have sufficient viscosity, then a form having an adequate wall height can be used to hold the dispensed photoluminescence material compound 731 around and over the array of LED chips 606. The photoluminescence material compound 731 comprises the photoluminescence material paste combined with a two-part curable silicone fluid, e.g., where the two-part curable silicone fluid is a dimethyl-based two-part curable silicone. Thereafter, as shown in FIG. 7B, the dispensed photoluminescence material compound 731 is cured (either fully or partially), e.g., by using application of heat 735, UV light 737, and/or appropriate chemicals. The correlated color temperature (CCT) and/or color rendering index (CRI) of light generated by depends on the thickness of the photoluminescence encapsulation 620 and the loading of photoluminescence material(s) within the encapsulation. For example for an encapsulation thickness of 1 to 2 mm when using a two-part silicone material with a viscosity of 5,000 centistokes (cSt) the weight loading of the about 10%-30% photoluminescence material paste (Table 1) in the photoluminescence material compound depending on the required CCT and/or CRI.

As well as providing a photoluminescence material paste, some embodiments of the invention find application in the manufacture of light diffusive components (that may not contain a photoluminescence material). According to an embodiment of the invention a light diffusive material paste comprises: a mixture of a light transmissive non-curable silicone fluid and particles of light diffusive material. The light diffusive material paste, "diffusive paste", can then be mixed with a two-part curable light transmissive silicone material and the resulting light diffusive material compound used in the manufacture of light diffusive optical components or a light diffusive portion of a remote photoluminescence wavelength conversion component. The non-curable silicone fluid can comprise a linear polydimethylsiloxane (PDMS), phenylmethyl polysiloxane or a methylhydrogen polysiloxane.

Preferably, the light diffusive material comprises nano-sized particles having an average particle size of between about 40 nm and about 100 nm. Particles of such size will scatter light differently depending on the wavelength of light. Where the light diffusive component is to be used in a blue light based LED system the particles of light diffusive material preferably have an average particle size of about 60 nm. The light diffusive material can comprise particles of Zinc Oxide (ZnO), titanium dioxide ($TiO_2$), barium sulfate ($BaSO_4$), magnesium oxide (MgO), silicon dioxide ($SiO_2$), aluminum oxide ($Al_2O_3$), or mixtures thereof.

The weight loading of the light diffusive material in the light diffusive paste can be in a range 10% to 60% depending on the intended method of manufacture of the light diffusive component. For example where a 2-D printing process (e.g., screen printing) is to used to deposit the light diffusive material the weight loading of the particles of the light diffusive material in the paste is in a range about 50% to about 60%. Where injection molding is to be used to manufacture the light diffusive component, the weight loading of light diffusive material to in the paste is in a range about 10% to about 20%.

Therefore, what has been described is an inventive photoluminescence material paste comprising a mixture of a light transmissive non-curable silicone fluid and particles of one or more inorganic photoluminescence material, such as a phosphor material. The photoluminescence material paste, can then be mixed with a curable light transmissive silicone material, typically a two-part curable silicone material, and the resulting photoluminescence material compound used in the manufacture of remote photoluminescence wavelength conversion components for solid-state, typically LED, light emitting devices and arrangements. Alternatively, the photoluminescence material compound can be deposited directly on the LED chips to manufacture photoluminescence wavelength converted solid-state light emitting devices.

This inventive approach provides numerous benefits, since it serves to reduce clumping of phosphor particles used for manufacturing LED lights structures, reduces separation of different phosphor materials when multiple phosphor material are used that have different specific gravities, and increases the shelf life of phosphor mixing products.

What is claimed is:
1. A photoluminescence material paste comprising:
a first inorganic photoluminescence material having a first density,
a second inorganic photoluminescence material having a second density, wherein the first density of the first inorganic photoluminescence material is different from the second density of the second inorganic photoluminescence material,
a light transmissive non-curable silicone fluid, wherein the first inorganic photoluminescence material and the second inorganic photoluminescence material are substantially homogenously distributed within the light transmissive silicone fluid to form the photoluminescence material paste,
wherein a weight loading of the first and second photoluminescence materials in the photoluminescence material paste is in a range of about 60% to about 95%, and wherein the non-curable silicone fluid is not curable by itself and is not curable when mixed with another material and wherein the non-curable silicone fluid comprises polyphenylmethylsiloxane.
2. A photoluminescence material paste comprising:
a first inorganic photoluminescence material having a first density,
a second inorganic photoluminescence material having a second density, wherein the first density of the first inorganic photoluminescence material is different from the second density of the second inorganic photoluminescence material,
a light transmissive non-curable silicone fluid, wherein the first inorganic photoluminescence material and the second inorganic photoluminescence material are substantially homogenously distributed within the light transmissive silicone fluid to form the photoluminescence material paste,
wherein a weight loading of the first and second photoluminescence materials in the photoluminescence material paste is in a range of about 60% to about 95%, and wherein the non-curable silicone fluid is not curable by itself and is curable when mixed with another material.
3. The photoluminescence material paste of claim 2, wherein the non-curable silicone fluid comprises one part of a two-part curable silicone material.
4. The photoluminescence material paste of claim 2, wherein a weight loading of the photoluminescence materials in the photoluminescence material paste is in a range from about 80% to about 90%.
5. The photoluminescence material paste of claim 2, wherein a weight loading of the photoluminescence materials in the photoluminescence material paste is in a range from about 70% to about 80%.

6. The photoluminescence material paste of claim 2, wherein the non-curable silicone fluid has a viscosity of between about 500 and about 100,000 centistokes.

7. The photoluminescence material paste of claim 2, wherein the photoluminescence materials have an average particle size of between about 5 μm and about 35 μm.

8. The photoluminescence material paste of claim 2, wherein the first photoluminescence material comprises a green light-emitting aluminate-based phosphor material.

9. The photoluminescence material paste of claim 8, wherein the green light-emitting aluminate-based phosphor consists of lutetium, cerium, at least one alkaline earth metal, aluminum, oxygen, and at least one halogen, wherein the phosphor is configured to absorb excitation radiation having a wavelength ranging from about 380 nm to about 480 nm, and to emit light having a peak emission wavelength ranging from about 500 nm to about 550 nm.

10. The photoluminescence material paste of claim 9, wherein the second photoluminescence material comprises a red-emitting nitride-based phosphor.

11. The photoluminescence material paste of claim 10, wherein the red-emitting phosphor comprises a nitride-based composition represented by the chemical formula $CaSr_b Si_c Al_d N_e Eu_f$, wherein: $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein $a+b+f > 2+d/2v$.

12. The photoluminescence material paste of claim 10, wherein the red-emitting phosphor comprises a nitride-based composition represented by the chemical formula $M_{(x/v)} M'_2 Si_{5-x} Al_x N_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x < 0.4$, and wherein said red-emitting phosphor has the general crystalline structure of $M'_2 Si_5 N_8$:RE, Al substitutes for Si within said general crystalline structure, and M is located within said general crystalline structure substantially at the interstitial sites.

13. The photoluminescence material paste of claim 2, wherein the photoluminescence materials have an average particle size of between about 15 μm and about 20 μm.

14. The photoluminescence material paste of claim 2, wherein the non-curable silicone fluid has a viscosity of about 5,000 centistokes.

15. A photoluminescence material paste comprising:
a first inorganic photoluminescence material having a first density,
a second inorganic photoluminescence material having a second density, wherein the first density of the first inorganic photoluminescence material is different from the second density of the second inorganic photoluminescence material,
a light transmissive non-curable silicone fluid, wherein the first inorganic photoluminescence material and the second inorganic photoluminescence material are substantially homogenously distributed within the light transmissive silicone fluid to form the photoluminescence material paste,
wherein the non-curable silicone fluid is not curable by itself, and
wherein a weight loading of the first and second photoluminescence materials in the photoluminescence material paste is in a range of about 60% to about 95% and wherein the first photoluminescence material has a first average particle size and the second photoluminescence material has a second average particle size, wherein the first average particle size is different from the average particle size of the second photoluminescence material.

16. The photoluminescence material paste of claim 15, wherein the non-curable silicone fluid is not curable by itself and is not curable when mixed with another material.

17. The photoluminescence material paste of claim 16, wherein the non-curable silicone fluid comprises polydimethylsiloxane.

18. A photoluminescence material paste comprising:
a first inorganic photoluminescence material having a first density,
a second inorganic photoluminescence material having a second density, wherein the first density of the first inorganic photoluminescence material is different from the second density of the second inorganic photoluminescence material,
a light transmissive non-curable silicone fluid, wherein the first inorganic photoluminescence material and the second inorganic photoluminescence material are substantially homogenously distributed within the light transmissive silicone fluid to form the photoluminescence material paste,
wherein the non-curable silicone fluid is not curable by itself, and wherein a weight loading of the first and second photoluminescence materials in the photoluminescence material paste is in a range of about 60% to about 95% and further comprising particles of a light diffusive material having an average particle size of between about 40 nm and about 500 nm.

19. The photoluminescence material paste of claim 18, wherein the particles of light diffusive material have an average particle size of about 60 nm.

20. The photoluminescence material paste of claim 18, wherein the light diffusive material is selected from the group consisting of: zinc oxide, titanium dioxide, barium sulfate, magnesium oxide, silicon dioxide, aluminum oxide, zirconium dioxide and mixtures thereof.

21. The photoluminescence material paste of claim 15, wherein the photoluminescence materials have an average particle size of between about 5 μm and about 35 μm.

22. The photoluminescence material paste of claim 15, wherein the photoluminescence materials have an average particle size of between about 15 μm and about 20 μm.

23. The photoluminescence material paste of claim 15, wherein the first photoluminescence material comprises a cerium-activated, green-emitting lutetium aluminate phosphor material.

24. The photoluminescence material paste of claim 23, wherein the cerium-activated, green-emitting lutetium aluminate phosphor consists of lutetium, cerium, at least one alkaline earth metal, aluminum, oxygen, and at least one halogen, wherein the phosphor is configured to absorb excitation radiation having a wavelength ranging from about 380 nm to about 480 nm, and to emit light having a peak emission wavelength ranging from about 500 nm to about 550 nm.

25. The photoluminescence material paste of claim 15, wherein the second photoluminescence material comprises a red-emitting nitride-based phosphor.

26. The photoluminescence material paste of claim 25, wherein the red-emitting phosphor comprises a nitride-based composition represented by the chemical formula $CaSr_b SiAl_d N_e Eu_f$, wherein: $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein $a+b+f > 2+d/2$.

27. The photoluminescence material paste of claim 25, wherein the red-emitting phosphor comprises a nitride-based composition represented by the chemical formula $M_{(x/v)} M'_2 Si_{5-x} Al_x N_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies 0.1≤x<0.4, and wherein said red-emitting phosphor has the general crystalline structure of $M'_2Si_5N_8$:RE, Al substitutes for Si within said general crystalline structure, and M is located within said general crystalline structure substantially at the interstitial sites.

28. The photoluminescence material paste of claim 15, wherein the non-curable silicone fluid is not curable by itself and is curable when mixed with another material.

29. The photoluminescence material paste of claim 28, wherein the non-curable silicone fluid comprises one part of a two-part curable silicone material.

30. The photoluminescence material paste of claim 15, wherein the first photoluminescence material comprises a green-emitting aluminate phosphor material and the second photoluminescence material comprises a red-emitting nitride-based phosphor.

\* \* \* \* \*